United States Patent
Forbes

(10) Patent No.: US 6,888,739 B2
(45) Date of Patent: May 3, 2005

(54) NANOCRYSTAL WRITE ONCE READ ONLY MEMORY FOR ARCHIVAL STORAGE

(75) Inventor: Leonard Forbes, Corvallis, OR (US)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 10/177,214

(22) Filed: Jun. 21, 2002

(65) Prior Publication Data

US 2003/0235081 A1 Dec. 25, 2003

(51) Int. Cl.$^7$ .............................................. G11C 11/24
(52) U.S. Cl. ..................... 365/149; 365/177; 257/300
(58) Field of Search ................. 365/149, 177; 257/300

(56) References Cited

U.S. PATENT DOCUMENTS

| | | | |
|---|---|---|---|
| 3,641,516 A | 2/1972 | Casrucci et al. | ............... 365/96 |
| 3,665,423 A | 5/1972 | Nakamuma et al. | .... 340/173 R |
| 3,877,054 A | 4/1975 | Boulin et al. | ................... 357/23 |
| 3,964,085 A | 6/1976 | Kahng et al. | ................ 428/428 |
| 4,152,627 A | 5/1979 | Priel et al. | ................... 315/227 |
| 4,217,601 A | 8/1980 | DeKeersmaecker et al. | .. 357/54 |

(Continued)

FOREIGN PATENT DOCUMENTS

| | | | | |
|---|---|---|---|---|
| JP | 03-222367 | 10/1991 | ......... | H01L/29/784 |
| JP | 06-224431 | 8/1994 | ......... | H01L/29/784 |
| JP | 06-302828 | 10/1994 | ......... | H01L/29/788 |
| JP | 08-255878 | 10/1996 | ......... | H01L/27/10 |
| WO | WO-9907000 A2 | 2/1999 | | |
| WO | WO-9917371 A1 | 4/1999 | ......... | H01L/29/49 |

OTHER PUBLICATIONS

Abbas, S. A., et al., "N–Channel Igfet Design Limitations Due to Hot Electron Trapping", *Technical Digest, International Electron Devices Meeting*, Washington, DC,(Dec. 1975),35–38.

Forbes, L. , et al., "Field Induced Re–Emission of Electrons Trapped in SiO", *IEEE Transactions on Electron Devices, ED–26 (11)*, Briefs,(Nov. 1979),1816–1818.

(Continued)

*Primary Examiner*—Hoai Ho
(74) *Attorney, Agent, or Firm*—Schwegman, Lundberg, Woessner & Kluth, P.A.

(57) ABSTRACT

Structures and methods for write once read only memory employing charge trapping are provided. The write once read only memory cell includes a metal oxide semiconductor field effect transistor (MOSFET) in a substrate. The MOSFET has a first source/drain region, a second source/drain region, and a channel region between the first and the second source/drain regions. A gate insulator is formed opposing the channel region. The gate insulator includes a number of high work function nanoparticles. A gate is formed on the gate insulator. A plug is coupled to the first source/drain region and couples the first source/drain region to an array plate. A transmission line is coupled to the second source/drain region. The MOSFET is a programmed MOSFET having a charge trapped in the number of high work function nanoparticles in the gate insulator adjacent to the first source/drain region.

43 Claims, 8 Drawing Sheets

U.S. PATENT DOCUMENTS

| | | | |
|---|---|---|---|
| 4,507,673 A | 3/1985 | Aoyama et al. | 357/23 R |
| 4,661,833 A | 4/1987 | Mizutani | 365/185.01 |
| 4,888,733 A | 12/1989 | Mobley | 365/145 |
| 4,939,559 A | 7/1990 | DiMaria et al. | 357/23.5 |
| 5,027,171 A | 1/1991 | Reedy et al. | 357/23.5 |
| 5,021,999 A | 6/1991 | Kohda et al. | 365/168 |
| 5,042,011 A | 8/1991 | Casper et al. | 365/205 |
| 5,111,430 A | 5/1992 | Morie | 365/185 |
| 5,253,196 A | 10/1993 | Shimabukuro | 365/45 |
| 5,280,205 A | 1/1994 | Green et al. | 307/530 |
| 5,293,560 A | 3/1994 | Harari | 365/185 |
| 5,298,447 A | 3/1994 | Hong | 437/43 |
| 5,317,535 A | 5/1994 | Talreja et al. | 365/185 |
| 5,388,069 A | 2/1995 | Kokubo | 365/185 |
| 5,399,516 A | 3/1995 | Bergendahl et al. | 437/43 |
| 5,410,504 A | 4/1995 | Ward | 365/149 |
| 5,430,670 A | 4/1995 | Rosenthal | 365/45 |
| 5,424,993 A | 6/1995 | Lee et al. | 365/218 |
| 5,434,815 A | 7/1995 | Smarandoiu et al. | 365/189.01 |
| 5,438,544 A | 8/1995 | Makino | 365/185 |
| 5,449,941 A | 9/1995 | Yamazaki et al. | 257/411 |
| 5,457,649 A | 10/1995 | Eichman et al. | 365/174 |
| 5,467,306 A | 11/1995 | Kaya et al. | 365/185.2 |
| 5,477,485 A | 12/1995 | Bergemont et al. | 365/185.24 |
| 5,485,422 A | 1/1996 | Bauer et al. | 365/168 |
| 5,493,140 A | 2/1996 | Iguchi | 257/316 |
| 5,508,543 A | 4/1996 | Hartstein et al. | 257/314 |
| 5,530,581 A | 6/1996 | Cogan | 359/265 |
| 5,530,668 A | 6/1996 | Chern et al. | 365/145 |
| 5,539,279 A | 7/1996 | Takeuchi et al. | 365/145 |
| 5,541,871 A | 7/1996 | Nishimura et al. | 365/145 |
| 5,541,872 A | 7/1996 | Lowrey et al. | 365/145 |
| 5,550,770 A | 8/1996 | Kuroda | 365/145 |
| 5,572,459 A | 11/1996 | Wilson et al. | 365/145 |
| 5,600,587 A | 2/1997 | Koike | 365/145 |
| 5,627,781 A | 5/1997 | Hayashi et al. | 365/185.2 |
| 5,627,785 A | 5/1997 | Gilliam et al. | 365/189.01 |
| 5,670,790 A | 9/1997 | Katoh et al. | 257/14 |
| 5,714,766 A | 2/1998 | Chen et al. | 257/20 |
| 5,740,104 A | 4/1998 | Forbes | 365/185.03 |
| 5,754,477 A | 5/1998 | Forbes | 365/185.33 |
| 5,768,192 A | 6/1998 | Eitan | 365/185.24 |
| 5,801,105 A | 9/1998 | Yano et al. | 438/785 |
| 5,801,401 A | 9/1998 | Forbes | 257/77 |
| 5,828,605 A | 10/1998 | Peng et al. | 365/185.29 |
| 5,852,306 A | 12/1998 | Forbes | 257/315 |
| 5,856,688 A | 1/1999 | Lee et al. | 257/295 |
| 5,886,368 A | 3/1999 | Forbes et al. | 257/77 |
| 5,912,488 A | 6/1999 | Kim et al. | 257/316 |
| 5,936,274 A | 8/1999 | Forbes et al. | 257/315 |
| 5,943,262 A | 8/1999 | Choi | 365/185.17 |
| 5,959,896 A | 9/1999 | Forbes | 365/185.33 |
| 5,989,958 A | 11/1999 | Forbes | 438/257 |
| 5,991,225 A | 11/1999 | Forbes et al. | 365/230.06 |
| 6,031,263 A | 2/2000 | Forbes et al. | 257/315 |
| 6,034,882 A | 3/2000 | Johnson et al. | 365/103 |
| 6,072,209 A | 6/2000 | Noble et al. | 257/296 |
| 6,115,281 A | 9/2000 | Aggarwal et al. | 365/145 |
| 6,125,062 A | 9/2000 | Ahn et al. | 365/198.07 |
| 6,140,181 A | 10/2000 | Forbes et al. | 438/257 |
| 6,141,237 A | 10/2000 | Eliason et al. | 365/145 |
| 6,141,238 A | 10/2000 | Forbes et al. | 365/145 |
| 6,141,260 A | 10/2000 | Ahn et al. | 365/189.07 |
| 6,150,687 A | 11/2000 | Noble et al. | 257/302 |
| 6,166,401 A | 12/2000 | Forbes | 257/77 |
| 6,185,122 B1 | 2/2001 | Johnson et al. | 365/103 |
| 6,232,643 B1 | 5/2001 | Forbes et al. | 257/405 |
| 6,243,300 B1 | 6/2001 | Sunkavalli | 365/185.29 |
| 6,246,606 B1 | 6/2001 | Forbes et al. | 365/185.03 |
| 6,249,020 B1 | 6/2001 | Forbes et al. | 257/315 |
| 6,252,793 B1 | 6/2001 | Allen et al. | 365/145 |
| 6,269,023 B1 | 7/2001 | Derhacobian et al. | 365/185.24 |
| 6,294,813 B1 | 9/2001 | Forbes et al. | 257/321 |
| 6,310,376 B1 | 10/2001 | Ueda et al. | 257/315 |
| 6,313,518 B1 | 11/2001 | Ahn et al. | 257/632 |
| 6,337,805 B1 | 1/2002 | Forbes et al. | 365/145 |
| 6,351,411 B2 | 2/2002 | Forbes et al. | 365/182 |
| 6,438,031 B1 | 8/2002 | Fastow | 365/185.18 |
| 6,449,188 B1 | 9/2002 | Fastow | 365/185.18 |
| 6,456,531 B1 | 9/2002 | Wang et al. | 365/185.18 |
| 6,456,536 B1 | 9/2002 | Sobek et al. | 365/185.28 |
| 6,459,618 B1 | 10/2002 | Wang | 365/185.18 |
| 6,487,121 B1 | 11/2002 | Thurgate et al. | 365/185.18 |
| 6,498,362 B1 | 12/2002 | Forbes et al. | 257/295 |
| 6,504,755 B1 | 1/2003 | Katayama et al. | 365/185.15 |
| 6,521,950 B1 | 2/2003 | Shimabukuro et al. | 257/350 |
| 6,521,958 B1 | 2/2003 | Forbes et al. | 257/391 |
| 6,545,314 B2 | 4/2003 | Forbes et al. | |
| 6,567,303 B1 | 5/2003 | Hamilton et al. | 365/185.03 |
| 6,570,787 B1 | 5/2003 | Wang et al. | 365/185.17 |
| 2002/0003252 A1 | 1/2002 | Iyer | 257/315 |
| 2002/0010958 A1 | 1/2002 | Forbes et al. | 257/224 |
| 2002/0027264 A1 | 3/2002 | Forbes et al. | 257/662 |
| 2002/0074565 A1 * | 6/2002 | Flagan et al. | 257/200 |

OTHER PUBLICATIONS

Hwang, N., et al., Tunneling and Thermal Emission of Electrons from a.

Distribution of Deep Traps in SiO, *IEEE Transactions on Electron Devices*, 40(6), (Jun. 1993), 1100–1103.

Lusky, et al., "Characterization of channel hot electron injection by the subthreshold slope of NROM/sup TM/device", *IEEE Electron Device Letters*, vol. 22, No. 11, (Nov. 2001), 556–558.

Ohring, Milton, "The Materials Science of Thin Films", *Academic Press Inc.*, (1992), 118, 121, 125.

Papadas, C., "Modeling of the Intrinsic Retention Characteristics of FLOTOX EEPROM Cells Under Elevated Temperature Conditions", *IEEE Transactions on Electron Devices, 42,* (Apr. 1995),678–682.

She, Min, et al., "Modeling and design study of nanocrystal memory devices", Device Research Conference, (2001), 139–40.

Sze, S M., *Physics of Semiconductor Devices*, (1981),pp. 504–506.

Liu, Z., et al., "Low Programming Voltages and Long Retention Time in Metal Nanocrystal EEPROM Devices", *Digest of the IEEE Device Research Conference*, Notre Dame, Indiana,(Jun. 25–27, 2001),79–80.

Adelmann, C, et al., "Atomic–layer epitaxy of GaN quantum wells and quantum dots on (0001) AlN", *Journal of Applied Physics, 91(8)*, (Apr. 15, 2002),5498–5500.

Akasaki, I., "Effects of AlN Buffer Layer on Crystallographic Structure and on Electrical and Optical Properties of GaN and Ga(1−x)A(x)N [0< x (< or =) 0.4] Films Grown on Sapphire Substrate by MOVPE", *Journal of Crystal Growth, 98*, (1989),209–219.

Alen, Petra, et al., "Atomic Layer Deposition of Ta(Al)N(C) Thin Films Using Trimethylaluminum as a Reducing Agent", *Journal of the Electrochemical Society, 148(10)*, (Oct. 2001),G566–G571.

Asari, K, et al., "Multi–mode and multi–level technologies for FeRAM embedded reconfigurable hardware", *SolidState Circuits Conference, 1999, Digest of Technical Papers. ISSCC. 1999 IEEE International*, (Feb. 15–17, 1999),106–107.

Benjamin, M., "UV Photoemission Study of Heteroepitaxial AlGaN Films Grown on 6H–SiC", *Applied Surface Science, 104/105*, (Sep. 1996),455–460.

Bermudez, V., "The Growth and Properties of Al and AlN Films on GaN(0001)–(1 × 1)", *Journal of Applied Physics, 79(1)*, (Jan. 1996),110–119.

Britton, J, et al., "Metal–nitride–oxide IC memory retains data for meter reader", *Electronics, 45(22)*, (Oct. 23, 1972), 119–23.

Carter, RJ., "Electrical Characterization of High–k Materials Prepared By Atomic Layer CVD", *IWGI*, (2001),94–99.

Chang, C., "Novel Passivation Dielectrics–The Boron–or Phosphorus–Doped Hydrogenated Amorphous Silicon Carbide Films", *Journal of the Electrochemical Society, 132*, (Feb. 1985),418–422.

Cricchi, J R., et al., "Hardened MNOS/SOS electrically reprogrammable nonvolatile memory", *IEEE Transactions on Nuclear Science, 24(6)*, (Dec. 1977),2185–9.

DeMichelis, F., "Influence of Doping on the Structural and Optoelectronic Properties of Amorphous and Microcrystalline Silicon Carbide", *Journal of Applied Physics, 72*, (Aug. 15, 1992),1327–1333.

DeMichelis, F., "Physical Properties of Undoped and Doped Microcrystalline SiC:H Deposited by PECVD", *Materials Research Society Symposium Proceedings, 219*, Anaheim, CA,(Apr. 30 –May 3, 1991),413–418.

DiMaria, D., "Graded or stepped energy band–gap–insulator MIS structures (GI–MIS or SI–MIS)", *J. Appl. Phys.*, 50(9), (Sep., 1979),5826–5829.

DiMaria, D J., "Graded or stepped energy band–gap–insulator MIS structures (GI–MIS or SI–MIS)", *Journal of Applied Physics, 50(9)*, (Sep. 1979),5826–5829.

Fauchet, P M., et al., "Optoelectronics and photovoltaic applications of microcrystalline SiC", *Symp. on Materials Issues in Mecrocrystalline Semiconductors*, (1989),291–292.

Ferris–Prabhu, A V., "Amnesia in layered insulator FET memory devices", *1973 International Electron Devices Meeting Technical Digest*, (1973),75–77.

Ferris–Prabhu, A V., "Charge transfer in layered insulators", *Solid–State Electronics, 16(9)*, (Sep. 1973),1086–7.

Ferris–Prabhu, A V., "Tunnelling theories of non–volatile semiconductor memories", *Physica Status Solidi A, 35(1)*, (May 16, 1976),243–50.

Fisch, D E., et al., "Analysis of thin film ferroelectric aging", *Proc. IEEE Int. Reliability Physics Symp.*, (1990),237–242.

Forsgren, Katarina, "Atomic Layer Deposition of HfO2 using hafnium iodide", *Conference held in Monterey, California*, (May 2001),1 page.

Frohman–Bentchkowsky, D, "An integrated metal–nitride–oxide–silicon (MNOS) memory", *Proceedings of the IEEE, 57(6)*, (Jun. 1969),1190–1192.

Guha, S, et al., "Atomic beam deposition of lanthanum–and yttrium–based oxide thin films for gate dielectrics", *Appl. Phys. Lett., 77*, (2000),2710–2712.

Koo, J, "Study on the characteristics of TiAlN thin film deposited by atomic layer deposition method", *Journal of Vacuum Science & Technology A–Vacuum Surfaces & Films, 19(6)*, (Nov. 2001),2831–4.

Kukli, K, et al., "Tailoring the dielectric properties of HfO2–Ta2O3 nanolaminates", *Appl. Phys. Lett., 68*, (1996), 3737–3739.

Lei, T., "Epitaxial Growth and Characterization of Zinc–Blende Gallium Nitride on (001) Silicon", *Journal of Applied Physics, 71(10)*, (May 1992),4933–4943.

Luan, H., "High Quality Ta2O5 Gate Dielectrics with Tox, eq<10A", *IEDM*, (1999),pp. 141–144.

Lusky, E, et al., "Characterization of Channel Hot Electron Injection by the Subthreshold Slope of NROM Device", *IEEE Electron Device Letters, 22(11)*, (Nov. 2001),556–558.

Marlid, Bjorn, et al., "Atomic layer deposition of BN thin films", *Thin Solid Films, 402(1–2)*, (Jan. 2002),167–171.

Martins, R, "Transport Properties of Doped Silicon Oxycarbide Microcrystalline Films Produced by Spatial Separation Techniques", *Solar Energy Materials and Solar Cells, 41–42*, (1996),493–517.

Martins, R., "Wide Band Gap Microcrystalline Silicon Thin Films", *Diffusion and Defect Data : Solid State Phenomena, 44–46, Part 1*, Scitec Publications,(1995),299–346.

Min, J., "Metal–organic atomic–layer deposition of titanium–silicon–nitride films", *Applied Physics Letters, 75(11)*, (1999),1521–1523.

Moazzami, R, "Endurance properties of Ferroelectric PZT thin films", *Int. Electron Devices Mtg.*, San Francisco, (1990),417–20.

Moazzami, R, "Ferroelectric PZT thin films for semiconductor memory", *Ph.D Thesis, University of California, Berkeley*, (1991).

Molnar, R., "Growth of Gallium Nitride by Electron–Cyclotron Resonance Plasma–Assisted Molecular–Beam Epitaxy: The Role of Charged Species", *Journal of Applied Physics, 76(8)*, (Oct. 1994),4587–4595.

Morishita, S, "Atomic–layer chemical–vapor–deposition of SiO/sub 2/by cyclic exposures of CH/sub 3/OSi(NCO)/sub 3/ and H/sub 2/O/sub 2/", *Japanese Journal of Applied Physics Part1–Regular Papers Short Notes & Review Papers, vol. 34, No. 10*, (Oct. 1995),5738–42.

Nakajima, Anri, "Soft breakdown free atomic–layer–deposited silicon–nitride/SiO/sub 2/ stack gate dielectrics", *International Electron Devices Meeting Technical Digest*, (2001),6.5.1–4.

Niilisk, A, "Atomic–scale optical monitoring of the initial growth of TiO2 thin films", *Proceedings of the SPIE –The International Society for Optical Engineering, 4318*, (2001), 72–77.

Puurunen, R L., et al., "Growth of aluminum nitride on porous silica by atomic layer chemical vapour deposition", *Applied Surface Science, 165(2–3)*, (Sep. 12, 2000),193–202.

Renlund, G. M., "Silicon oxycarbide glasses: Part I. Preparation and chemistry", *J. Mater. Res.*, (Dec., 1991),pp. 2716–2722.

Renlund, G.M., "Silicon oxycarbide glasses: Part II. Structure and properties", *J. Mater. Res.*, vol. 6, No. 12,(Dec., 1991),pp. 2723–2734.

Robertson, J., "Band offsets of wide–band–gap oxides and implications for future electronic devices", *Journal of Vacuum Science & Technology B (Microelectronics and Nanometer Structures), 18(3)*, (May–Jun. 2000),1785–1791.

Sze, S M., "Physics of semiconductor devices", *New York: Wiley*, (1981),504–506.

Wei, L S., et al., "Trapping, emission and generation in MNOS memory devices", *Solid–State Electronics, 17(6)*, (Jun. 1974),591–8.

White, M H., et al., "Characterization of thin–oxide MNOS memory transistors", *IEEE Transactions on Electron Devices, ED–19(12)*, (Dec. 1972),1280–1288.

White, M H., "Direct tunneling in metal–nitride–oxide–silicon (MNOS) structures", *Programme of the 31st physical electronics conference*, (1971),1.

Wood, S W., "Ferroelectric memory design", *M.A.Sc. thesis, University of Toronto*, (1992).

Yoder, M, "Wide Bandgap Semiconductor Materials and Devices", *IEEE Transactions on Electron Devices, 43*, (Oct. 1996),1633–1636.

Zhu, W J., et al., "Current transport in metal/hafnium oxide/silicon structure", *IEEE Electron Device Letters, 23*, (2002),97–99.

* cited by examiner

NANOCRYSTAL WRITE ONCE READ ONLY MEMORY FOR ARCHIVAL STORAGE

CROSS REFERENCE TO RELATED APPLICATIONS

This application is related to the following co-pending, commonly assigned U.S. patent applications: "Write Once Read Only Memory Employing Charge Trapping in Insulators," Ser. No. 10/177,077, "Write Once Read Only Memory Employing Floating Gates," Ser. No. 10/177,083, "Write Once Read Only Memory with Large Work Function Floating Gates," Ser. No. 10/177,213, "Vertical NROM Having a Storage Density of 1 Bit per $1F^2$," Ser. No. 10/177,208, "Ferroelectric Write Once Read Only Memory for Archival Storage," Ser. No. 10/177,082, and "Multistate NROM Having a Storage Density Much Greater than 1 Bit per $1F^2$," Ser. No. 10/177,211, which are filed on even date herewith and each of which disclosure is herein incorporated by reference.

FIELD OF THE INVENTION

The present invention relates generally to semiconductor integrated circuits and, more particularly, to nanocrystal write once read only memory for archival storage.

BACKGROUND OF THE INVENTION

Many electronic products need various amounts of memory to store information, e.g. data. One common type of high speed, low cost memory includes dynamic random access memory (DRAM) comprised of individual DRAM cells arranged in arrays. DRAM cells include an access transistor, e.g a metal oxide semiconducting field effect transistor (MOSFET), coupled to a capacitor cell. With successive generations of DRAM chips, an emphasis continues to be placed on increasing array density and maximizing chip real estate while minimizing the cost of manufacture. It is further desirable to increase array density with little or no modification of the DRAM optimized process flow.

A requirement exists for memory devices which need only be programmed once, as for instance to function as an electronic film in a camera. If the memory arrays have a very high density then they can store a large number of very high resolution images in a digital camera. If the memory is inexpensive then it can for instance replace the light sensitive films which are used to store images in conventional cameras. And, if the memory retention time is long then the memory can be used to replace microfilm and used for archival storage.

Thus, there is a need for improved DRAM technology compatible write once read only memory. It is desirable that such write once read only memory be fabricated on a DRAM chip with little or no modification of the DRAM process flow. It is further desirable that such write once read only memory operate with lower programming voltages than that used by conventional flash memory cells, yet still hold sufficient charge to withstand the effects of parasitic capacitances and noise due to circuit operation.

REFERENCES

L. Forbes, W. P. Noble and E. H. Cloud, "MOSFET Technology for Programmable Address Decode and Correction," application Ser. No. 09/383,804, now U.S. Pat. No. 6,521,950;

L. Forbes, E. Sun, R. Alders and J. Moll, "Field Induced Re-Emission of Electrons Trapped in $SiO_2$," IEEE Trans. Electron Device, vol. ED-26, no. 11, pp. 1816–1818 (November 1979);

S. S. B. Or, N. Hwang, and L. Forbes, "Tunneling and Thermal Emission From a Distribution of Deep Traps in $SiO_2$," IEEE Trans. on Electron Devices, vol. 40, no. 6, pp. 1100–1103 (June 1993);

S. A. Abbas and R. C. Dockerty, "N-Channel IGFET Design Limitations Due to Hot Electron Trapping," IEEE Int. Electron Devices Mtg., Washington D.C., December 1975, pp. 35–38);

B. Eitan et al., "Characterization of Channel Hot Electron Injection by the Subthreshold Slope of NROM device," IEEE Electron Device Lett., Vol. 22, No. 11, pp. 556–558, (November 2001);

B. Etian et al., "NROM: A novel localized Trapping, 2-Bit Nonvolatile Memory Cell," IEEE Electron Device Lett., Vol. 21, No. 11, pp. 543–545, (November 2000);

S. Sze, Physics of Semiconductor Devices, Wiley, N.Y., 1981, pp. 504–506;

L. Forbes and J. Geusic, "Memory Using Insulator Traps," U.S. Pat. No. 6,140,181, issued Oct. 31, 2000;

C. Hu et al., "Modeling and Design Study of Nanocrystal Memory Devices," IEEE Device Research Conf., Notre Dame, Ind., June 2001, pp. 139–140;

L. Forbes, "Flash Memory With Microcrystalline Silicon Carbide as the Floating Gate Structure," U.S. Pat. Nos. 5,801,401, issued September 1998, 5,989,958, issued Nov. 23, 1999, 6,166,401, Dec. 26, 2000;

L. Forbes, J. Geusic and K. Ahn, "Microcrystalline Silicon Oxycarbide Gates," U.S. Pat. No. 5,886,368, issued Mar. 23, 1999;

L. Forbes and K. Y. Ahn, "DEAPROM and Transistor with Gallium Nitride or Gallium Aluminum Nitride Gate," U.S. Pat. No. 6,031,263, issued Feb. 29, 2000;

L. Forbes, "Flash Memory with Nanocrystalline Silicon Film as the Floating Gate," U.S. Pat. No. 5,852,306, issued Dec. 22, 1998.

SUMMARY OF THE INVENTION

The above mentioned problems for creating DRAM technology compatible write once read only memory cells as well as other problems are addressed by the present invention and will be understood by reading and studying the following specification. This disclosure teaches structures and methods using MOSFET devices as write once read only memory in a DRAM integrated circuit. The structures and methods use the existing process sequence for MOSFET's in DRAM technology.

In particular, an illustrative embodiment of the present invention includes a write once read only memory cell. The write once read only memory cell includes a metal oxide semiconductor field effect transistor (MOSFET) in a substrate. The MOSFET has a first source/drain region, a second source/drain region, and a channel region between the first and the second source/drain regions. A gate insulator is formed opposing the channel region. The gate insulator includes a number of high work function nanoparticles. A gate is formed on the gate insulator. A plug is coupled to the first source/drain region and couples the first source/drain region to an array plate. A transmission line is coupled to the second source/drain region. The MOSFET is a programmed MOSFET having a charge trapped in the number of high work function nanoparticles in the gate insulator adjacent to the first source/drain region such that the channel region has a first voltage threshold region (Vt1) and a second voltage threshold region (Vt2) and such that the programmed MOSFET operates at reduced drain source current.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

Figure 1A:
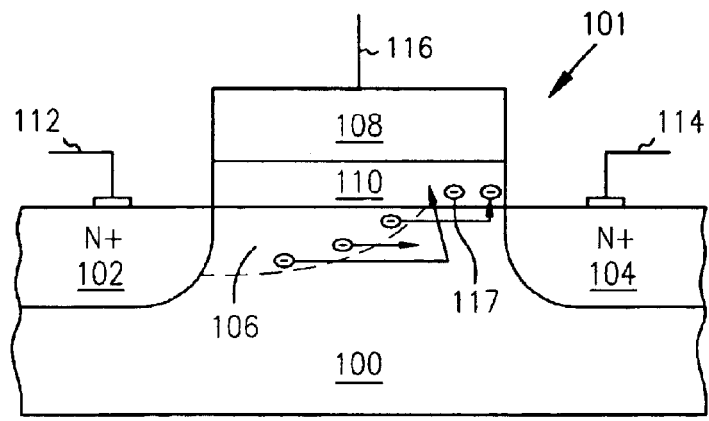
FIG. 1A is a block diagram of a metal oxide semiconductor field effect transistor (MOSFET) in a substrate according to the teachings of the prior art.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

FIG. 1A is useful in illustrating the conventional operation of a MOSFET such as can be used in a DRAM array. FIG. 1A illustrates the normal hot electron injection and degradation of devices operated in the forward direction. As is explained below, since the electrons are trapped near the drain they are not very effective in changing the device characteristics.

FIG. 1A is a block diagram of a metal oxide semiconductor field effect transistor (MOSFET) 101 in a substrate 100. The MOSFET 101 includes a source region 102, a drain region 104, a channel region 106 in the substrate 100 between the source region 102 and the drain region 104. A gate 108 is separated from the channel region 108 by a gate oxide 110. A sourceline 112 is coupled to the source region 102. A bitline 114 is coupled to the drain region 104. A wordline 116 is coupled to the gate 108.

In conventional operation, a drain to source voltage potential (Vds) is set up between the drain region 104 and the source region 102. A voltage potential is then applied to the gate 108 via a wordline 116. Once the voltage potential applied to the gate 108 surpasses the characteristic voltage threshold (Vt) of the MOSFET a channel 106 forms in the substrate 100 between the drain region 104 and the source region 102. Formation of the channel 106 permits conduction between the drain region 104 and the source region 102, and a current signal (Ids) can be detected at the drain region 104.

Figure 1B:
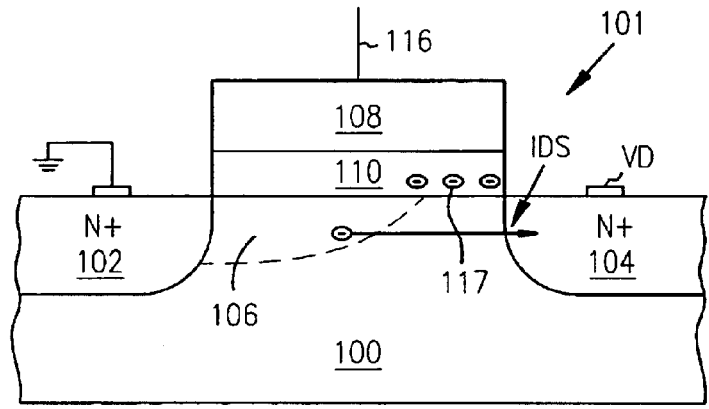
FIG. 1B illustrates the MOSFET of FIG. 1A operated in the forward direction showing some degree of device degradation due to electrons being trapped in the gate oxide near the drain region over gradual use.

In operation of the conventional MOSFET of FIG. 1A, some degree of device degradation does gradually occur for MOSFETs operated in the forward direction by electrons 117 becoming trapped in the gate oxide 110 near the drain region 104. This effect is illustrated in FIG. 1B. However, since the electrons 117 are trapped near the drain region 104 they are not very effective in changing the MOSFET characteristics.

Figure 1C:
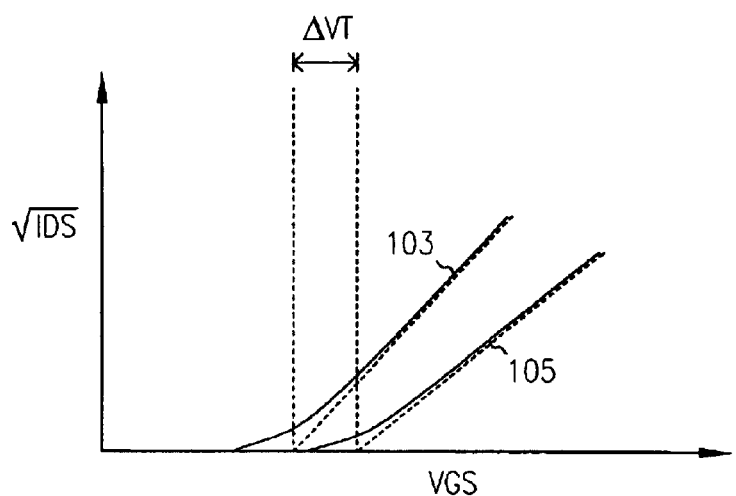
FIG. 1C is a graph showing the square root of the current signal (Ids) taken at the drain region of the conventional MOSFET versus the voltage potential (VGS) established between the gate and the source region.

FIG. 1C illustrates this point. FIG. 1C is a graph showing the square root of the current signal (Ids) taken at the drain region versus the voltage potential (VGS) established between the gate 108 and the source region 102. The change in the slope of the plot of $\sqrt{Ids}$ versus VGS represents the change in the charge carrier mobility in the channel 106.

In FIG. 1C, $\Delta VT$ represents the minimal change in the MOSFET's threshold voltage resulting from electrons gradually being trapped in the gate oxide 110 near the drain region 104, under normal operation, due to device degradation. This results in a fixed trapped charge in the gate oxide 110 near the drain region 104. Slope 103 represents the charge carrier mobility in the channel 106 for FIG. 1A having no electrons trapped in the gate oxide 110. Slope 105 represents the charge mobility in the channel 106 for the conventional MOSFET of FIG. 1B having electrons 117 trapped in the gate oxide 110 near the drain region 104. As shown by a comparison of slope 103 and slope 105 in FIG. 1C, the electrons 117 trapped in the gate oxide 110 near the drain region 104 of the conventional MOSFET do not significantly change the charge mobility in the channel 106.

There are two components to the effects of stress and hot electron injection. One component includes a threshold voltage shift due to the trapped electrons and a second component includes mobility degradation due to additional scattering of carrier electrons caused by this trapped charge and additional surface states. When a conventional MOSFET degrades, or is "stressed," over operation in the forward direction, electrons do gradually get injected and become trapped in the gate oxide near the drain. In this portion of the conventional MOSFET there is virtually no channel underneath the gate oxide. Thus the trapped charge modulates the threshold voltage and charge mobility only slightly.

The inventor, along with others, has previously described programmable memory devices and functions based on the reverse stressing of MOSFET's in a conventional CMOS process and technology in order to form programmable address decode and correction in U.S. Pat. No. 6,521,950 entitled "MOSFET Technology for Programmable Address Decode and Correction." That disclosure, however, did not describe write once read only memory solutions, but rather address decode and correction issues.

According to the teachings of the present invention, normal MOSFETs can be programmed by operation in the reverse direction and utilizing avalanche hot electron injection to trap electrons in a number of high work function nanoparticles, or nanocrystals, within a gate oxide of the MOSFET. When the programmed MOSFET is subsequently operated in the forward direction the electrons, trapped in the number of high work function nanoparticles, or nanocrystals, within the gate oxide, are near the source and cause the channel to have two different threshold voltage regions. The novel programmed MOSFETs of the present invention conduct significantly less current than conventional MOSFETs, particularly at low drain voltages. These electrons will remain trapped in the number of high work function nanoparticles, or nanocrystals, within the gate oxide gate unless negative gate voltages are applied. The electrons will not be removed from the number of high work function nanoparticles, or nanocrystals, within a gate oxide when positive or zero gate voltages are applied. Erasure can be accomplished by applying negative gate voltages and/or increasing the temperature with negative gate bias applied to cause the trapped electrons to be re-emitted back into the silicon channel of the MOSFET.

Figure 2A:
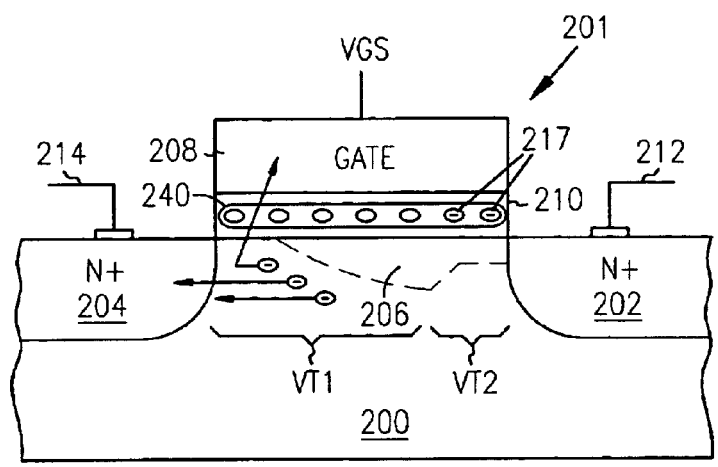
FIG. 2A is a diagram of a programmed MOSFET which can be used as a write once read only memory cell according to the teachings of the present invention.
Figure 2B:
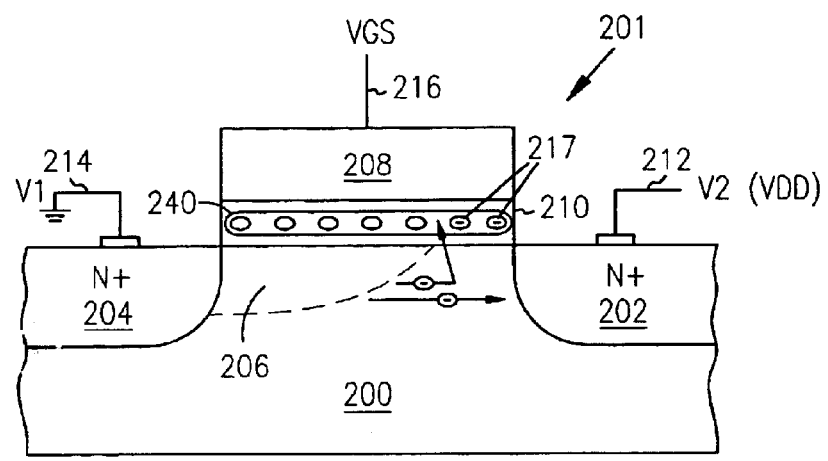
FIG. 2B is a diagram suitable for explaining the method by which the MOSFET of the write once read only memory cell of the present invention can be programmed to achieve the embodiments of the present invention.
Figure 2C:
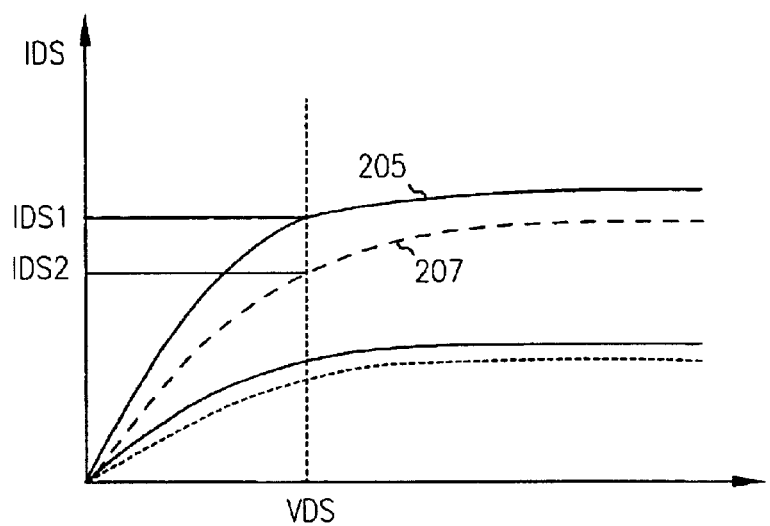
FIG. 2C is a graph plotting the current signal (Ids) detected at the drain region versus a voltage potential, or drain voltage, (VDS) set up between the drain region and the source region (Ids vs. VDS).

FIGS. 2A–2C illustrate are useful in illustrating the present invention in which a much larger change in device characteristics is obtained by programming the device in the reverse direction and subsequently reading the device by operating it in the forward direction.

FIG. 2A is a diagram of a programmed MOSFET which can be used as a write once read only memory cell according to the teachings of the present invention. As shown in FIG. 2A the write once read only memory cell 201 includes a MOSFET in a substrate 200 which has a first source/drain region 202, a second source/drain region 204, and a channel region 206 between the first and second source/drain regions, 202 and 204. In one embodiment, the first source/drain region 202 includes a source region 202 for the MOSFET and the second source/drain region 204 includes a drain region 204 for the MOSFET. FIG. 2A further illustrates a gate 208 separated from the channel region 206 by a gate oxide 210. According to the teachings of the present invention, a number of high work function nanoparticles, or nanocrystals, 240 are located within the gate oxide 210. A first transmission line 212 is coupled to the first source/drain region 202 and a second transmission line 214 is coupled to the second source/drain region 204. In one embodiment, the first transmission line includes a sourceline 212 and the second transmission line includes a bit line 214.

As stated above, write once read only memory cell 201 is comprised of a programmed MOSFET. This programmed MOSFET has a charge 217 trapped in the number of high work function nanoparticles, or nanocrystals, 240 within the gate oxide 210 adjacent to the first source/drain region 202 such that the channel region 206 has a first voltage threshold region (Vt1) and a second voltage threshold region (Vt2) in the channel 206. In one embodiment, the charge 217 trapped in the number of high work function nanoparticles, or nanocrystals, 240 within the gate oxide 210 adjacent to the first source/drain region 202 includes a trapped electron charge 217.

FIG. 2A illustrates the Vt2 in the channel 206 is adjacent the first source/drain region 202 and that the Vt1 in the channel 206 is adjacent the second source/drain region 204. According to the teachings of the present invention, Vt2 has a higher voltage threshold than Vt1 due to the charge 217 trapped in the number of high work function nanoparticles, or nanocrystals, 240 within a gate oxide 210 adjacent to the first source/drain region 202.

FIG. 2B is a diagram suitable for explaining the method by which the MOSFET of the write once read only memory cell 201 of the present invention can be programmed to achieve the embodiments of the present invention. As shown in FIG. 2B the method includes programming the MOSFET in a reverse direction. Programming the MOSFET in the reverse direction includes applying a first voltage potential V1 to a drain region 204 of the MOSFET. In one embodiment, applying a first voltage potential V1 to the drain region 204 of the MOSFET includes grounding the drain region 204 of the MOSFET as shown in FIG. 2B. A second voltage potential V2 is applied to a source region 202 of the MOSFET. In one embodiment, applying a second voltage potential V2 to the source region 202 includes applying a high positive voltage potential (VDD) to the source region 202 of the MOSFET, as shown in FIG. 2B. A gate potential VGS is applied to a gate 208 of the MOSFET. In one embodiment, the gate potential VGS includes a voltage potential which is less than the second voltage potential V2, but which is sufficient to establish conduction in the channel 206 of the MOSFET between the drain region 204 and the source region 202. As shown in FIG. 2B, applying the first, second and gate potentials (V1, V2, and VGS respectively) to the MOSFET creates a hot electron injection into a number of high work function nanoparticles, or nanocrystals, 240 within the gate oxide 210 of the MOSFET adjacent to the source region 202. In other words, applying the first, second and gate potentials (V1, V2, and VGS respectively) provides enough energy to the charge carriers, e.g. electrons, being conducted across the channel 206 that, once the charge carriers are near the source region 202, a number of the charge carriers get excited into the number of high work function nanoparticles, or nanocrystals, 240 within the gate oxide 210 adjacent to the source region 202. Here the charge carriers become trapped.

In one embodiment of the present invention, the method is continued by subsequently operating the MOSFET in the forward direction in its programmed state during a read operation. Accordingly, the read operation includes grounding the source region 202 and precharging the drain region a fractional voltage of VDD. If the device is addressed by a wordline coupled to the gate, then its conductivity will be determined by the presence or absence of stored charge in the number of high work function nanoparticles, or nanocrystals, 240 within the gate oxide 210. That is, a gate potential can be applied to the gate 208 by a wordline 216 in an effort to form a conduction channel between the source and the drain regions as done with addressing and reading conventional DRAM cells.

However, now in its programmed state, the conduction channel 206 of the MOSFET will have a first voltage threshold region (Vt1) adjacent to the drain region 204 and a second voltage threshold region (Vt2) adjacent to the source region 202, as explained and described in detail in connection with FIG. 2A. According to the teachings of the present invention, the Vt2 has a greater voltage threshold than the Vt1 due to the hot electron injection 217 into a number of high work function nanoparticles, or nanocrystals, 240 within the gate oxide 210 of the MOSFET adjacent to the source region 202.

FIG. 2C is a graph plotting a current signal (Ids) detected at the second source/drain region 204 versus a voltage potential, or drain voltage, (VDS) set up between the second source/drain region 204 and the first source/drain region 202 (Ids vs. VDS). In one embodiment, VDS represents the voltage potential set up between the drain region 204 and the source region 202. In FIG. 2C, the curve plotted as 205 represents the conduction behavior of a conventional MOSFET where the MOSFET is not programmed (is normal or not stressed) according to the teachings of the present invention. The curve 207 represents the conduction behavior of the programmed MOSFET (stressed), described above in connection with FIG. 2A, according to the teachings of the present invention. As shown in FIG. 2C, for a particular drain voltage, VDS, the current signal (IDS2) detected at the second source/drain region 204 for the programmed MOSFET (curve 207) is significantly lower than the current signal (IDS1) detected at the second source/drain region 204 for the conventional MOSFET (curve 205) which is not programmed according to the teachings of the present invention. Again, this is attributed to the fact that the channel 206 in the programmed MOSFET of the present invention has two voltage threshold regions and that the voltage threshold, Vt2, near the first source/drain region 202 has a higher voltage threshold than Vt1 near the second source/drain region due to the charge 217 trapped in the number of high work function nanoparticles, or nanocrystals, 240 within the gate oxide 210 adjacent to the first source/drain region 202.

Some of these effects have recently been described for use in a different device structure, called an NROM, for flash memories. This latter work in Israel and Germany is based on employing charge trapping in a silicon nitride layer in a non-conventional flash memory device structure. Charge trapping in silicon nitride gate insulators was the basic mechanism used in MNOS memory devices, charge trapping in aluminum oxide gates was the mechanism used in MIOS memory devices, and the present inventor, along with another, disclosed charge trapping at isolated point defects in gate insulators in U.S. Pat. No. 6,140,181 entitled "Memory Using Insulator Traps."

In contrast to the above work, the present invention discloses programming a MOSFET in a reverse direction to trap charge in a number of high work function nanoparticles, or nanocrystals, 240 within a gate oxide 210 near the source region 202 and reading the device in a forward direction to form a write once memory based on a modification of DRAM technology.

Prior art DRAM technology generally employs silicon oxide as the gate insulator. Further the emphasis in conventional DRAM devices is placed on trying to minimize charge trapping in the silicon oxide gate insulator. According to the teachings of the present invention, a number of high work function nanoparticles, or nanocrystals, within a gate oxide are used to trap electrons more efficiently than in silicon oxide. That is, in the present invention, the write-once-read-only-memory (WOROM) employs charge trapping in a number of high work function nanoparticles, or nanocrystals, within a gate oxide. According to the teachings of the present invention, the number of high work function nanoparticles, or nanocrystals, include refractory metal nanoparticles isolated from each other and electrically floating to act as floating gates. In one embodiment, the refractory metal nanoparticles are selected from the group of molybdenum (Mo) and tungsten (W) with work functions of approximately 4.7 eV. In another embodiment of the present invention, the number of high work function nanoparticles include large work function nanocrystals selected from the group of p-type nanocrystals of silicon germanium for gates, p-type nanocrystals gates of other semiconductors as silicon carbide, silicon oxycarbide, gallium nitride (GaN), and aluminum gallium nitride (AlGaN). Again, the nanocrystals are isolated from one another and not in conductive contact. In still other embodiments according to the present invention, the number of high work function nanoparticles include heavily doped p-type polysilicon floating and isolated nanocrystals with a vacuum work function of 5.3 eV.

Figure 3:
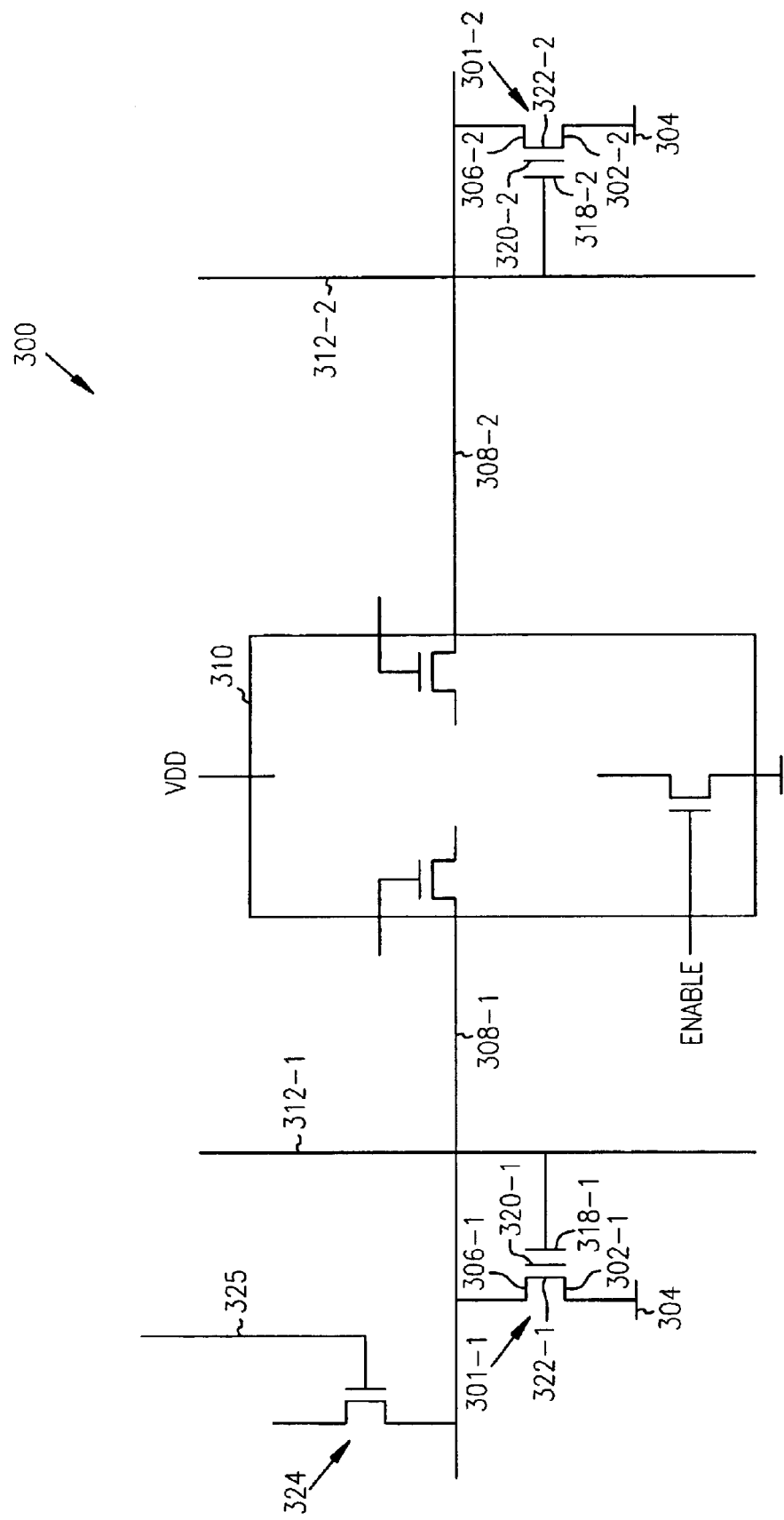
FIG. 3 illustrates a portion of a memory array according to the teachings of the present invention.

FIG. 3 illustrates a portion of a memory array 300 according to the teachings of the present invention. The memory in FIG. 3, is shown illustrating a pair of write once read only memory cells 301-1 and 301-2 formed according to the teachings of the present invention. As one of ordinary skill in the art will understand upon reading this disclosure, any number of write once and read only memory cells can be organized in an array, but for ease of illustration only two are displayed in FIG. 3. As shown in FIG. 3, a first source/drain region, 302-1 and 302-2 respectively, is coupled to an array plate 304. A second source/drain region, 306-1 and 306-2 respectively, is coupled to a bitline, 308-1 and 308-2 respectively. Each of the bitlines, 308-1 and 308-2, couple to a sense amplifier, shown generally at 310. A wordline, 312-1 and 312-2 respectively, is couple to a gate, 314-1 and 314-2 respectively, for each of the write once read only memory cells, 301-1 and 301-2. Finally, a write data/precharge circuit is shown at 324 for coupling a first or a second potential to bitline 308-1. The illustrated write data/precharge circuit 324 is connected to a write data/precharge control line 325. As one of ordinary skill in the art will understand upon reading this disclosure, the write data/precharge circuit 324 is adapted to couple either a ground to the bitline 308-1 during a write operation in the reverse direction, or alternatively to precharge the bitline 308-1 to fractional voltage of VDD during a read operation in the forward direction. As one of ordinary skill in the art will understand upon reading this disclosure, the array plate 304 can be biased to a voltage higher than VDD during a write operation in the reverse direction, or alternatively grounded during a read operation in the forward direction.

As shown in FIG. 3, the array structure 300, including write once read only memory cells 301-1 and 301-2, has no capacitors. Instead, according to the teachings of the present invention, the first source/drain region or source region, 302-1 and 302-2, are coupled via a conductive plug directly to the array plate 304. In order to write, the array plate 304 is biased to voltage higher than VDD and the devices stressed in the reverse direction by grounding the data orbit line, 308-1 or 308-2. If the write once read only memory cell, 301-1 or 301-2, is selected by a word line address, 312-1 or 312-2, then the write once read only memory cell, 301-1 or 301-2, will conduct and be stressed with accompanying hot electron injection into a number of high work function nanoparticles, or nanocrystals, 340 within a gate oxide 310 adjacent to the source region, 302-1 or 302-2. During read the write once read only memory cells, 301-1 or 301-2, are operated in the forward direction with the array plate 304 grounded and the bit line, 308-1 or 308-2, and respective second source/drain region or drain region, 306-1 and 306-2, of the cells precharged to some fractional voltage of Vdd. If the device is addressed by the word line, 312-1 or 312-2, then its conductivity will be determined by the presence or absence of stored charge in the number of high work function nanoparticles, or nanocrystals, within a gate oxide adjacent to the source region, 302-1 or 302-2 and so detected using the DRAM sense amplifier 310. The operation of DRAM sense amplifiers is described, for example, in U.S. Pat. Nos. 5,627,785; 5,280,205; and 5,042,011, all assigned to Micron Technology Inc., and incorporated by reference herein. The array would thus be addressed and read in the conventional manner used in DRAM's, but programmed as write once read only memory cells in a novel fashion.

In operation the devices would be subjected to hot electron stress in the reverse direction by biasing the array plate 304, and read while grounding the array plate 304 to compare a stressed write once read only memory cell, e.g. cell 301-1, to an unstressed dummy device/cell, e.g. 301-2, as shown in FIG. 3. The write and possible erase feature could be used during manufacture and test to initially program all cells or devices to have similar or matching conductivity before use in the field. The sense amplifier 310 can then detect small differences in cell or device characteristics due to stress induced changes in device characteristics during the write operation. That is the sense amplifier 310 can detect a charge trapped in the number of high work function nanoparticles, or nanocrystals, 340 within a gate oxide 310 adjacent to the source region, 302-1 or 302-2.

As one of ordinary skill in the art will understand upon reading this disclosure such arrays of write once read only memory cells are conveniently realized by a modification of DRAM technology. As stated above and according to the teachings of the present invention, the number of high work function nanoparticles, or nanocrystals, include refractory metal nanoparticles isolated from each other and electrically floating to act as floating gates. In one embodiment, the refractory metal nanoparticles are selected from the group of molybdenum (Mo) and tungsten (W) with work functions of approximately 4.7 eV. In another embodiment of the present invention, the number of high work function nanoparticles include large work function nanocrystals selected from the group of p-type nanocrystals of silicon germanium for gates, p-type nanocrystals gates of other semiconductors as silicon carbide, silicon oxycarbide, gallium nitride (GaN), and aluminum gallium nitride (AlGaN). Again, the nanocrystals are isolated from one another and not in conductive contact. In still other embodiments according to the present invention, the number of high work function nanoparticles include heavily doped p-type polysilicon floating and isolated nanocrystals with a vacuum work function of 5.3 eV. Conventional transistors for address decode and sense amplifiers can be fabricated after this step with normal thin gate insulators of silicon oxide.

Figure 4A:
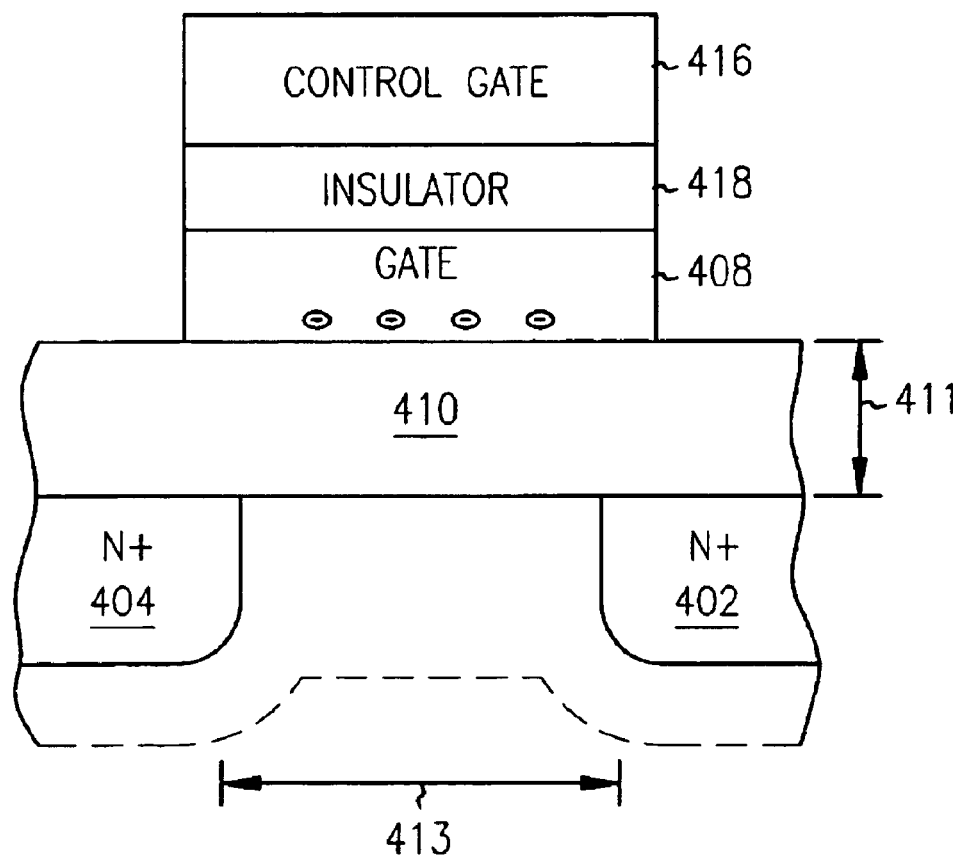
FIGS. 4A–4B illustrates the operation of the novel write once read only memory cell formed according to the teachings of the present invention.
Figure 4B:
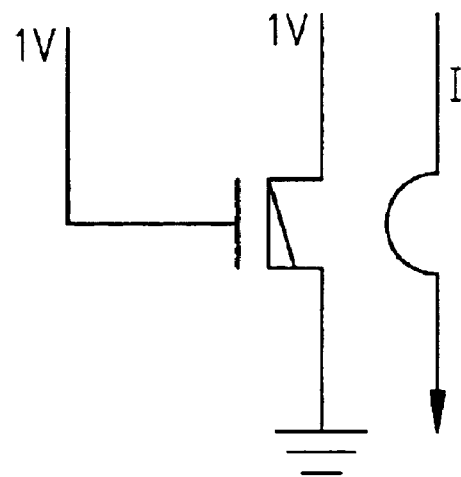
Figure 5:
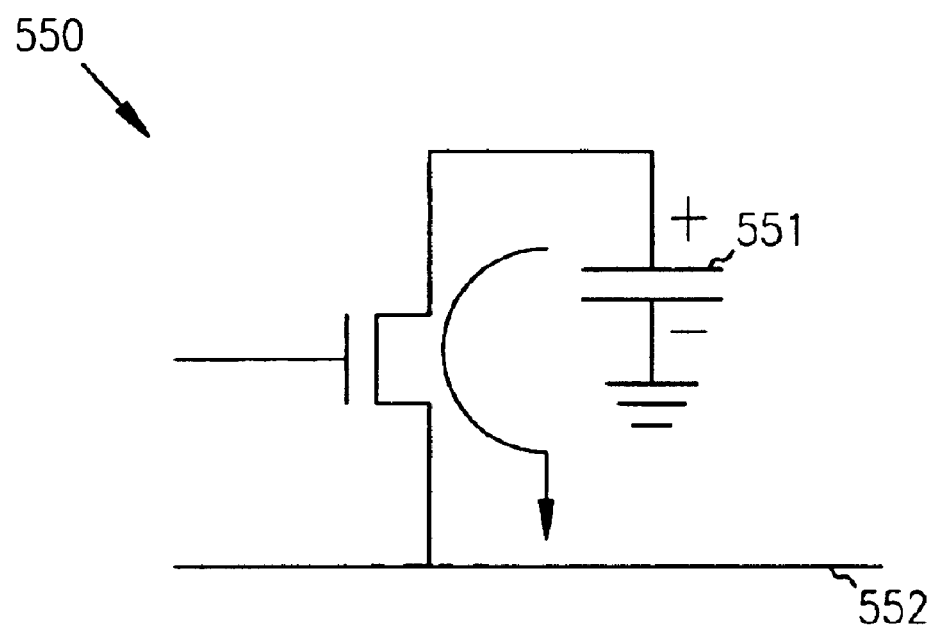
FIG. 5 illustrates the operation of a conventional DRAM cell.

FIGS. 4A–B and 5 are useful in illustrating the use of charge storage in a number of high work function nanoparticles, or nanocrystals, within a gate oxide to modulate the conductivity of the write once read only memory cell according to the teachings of the present invention. That is, FIGS. 4A–4B illustrates the operation of the novel write once read only memory cell 401 formed according to the teachings of the present invention. And, FIG. 5 illustrates the operation of a conventional DRAM cell 501. As shown in FIG. 4A, the gate insulator 410 is made thicker than in a conventional DRAM cell. For example, an embodiment of the gate insulator 410 has a thickness 411 equal to or greater than 10 nm or 100 Å ($10^{-6}$ cm). And, the gate insulator 410 includes a number of high work function nanoparticles, or nanocrystals, 440 formed therein which are isolated from each other and electrically floating, e.g. not in conductive contact, to act as floating gates. In the embodiment shown in FIG. 4A a write once read only memory cell has dimensions 413 of 0.1 $\mu$m ($10^{-5}$ cm) by 0.1 $\mu$m. The capacitance, Ci, of the structure depends on the dielectric constant, $\in_i$, and the thickness of the insulating layers, t. In an embodiment, the dielectric constant is $0.3 \times 10^{-12}$ F/cm and the thickness of the insulating layer is $10^{-6}$ cm such that Ci=$\in$i/t, Farads/cm$^2$ or $3 \times 10^{-7}$ F/cm$^2$. In one embodiment, a charge 417 of $10^{12}$ electrons/cm$^2$ is programmed into the number of high work function nanoparticles, or nanocrystals, 440 within the gate oxide 410 adjacent to the source region 402 of the write once read only memory cell 401. This produces a stored charge $\Delta Q = 10^{12}$ electrons/cm$^2 \times 1.6 \times 10^{-19}$ Coulombs. In this embodiment, the resulting change in the threshold voltage ($\Delta$Vt) of the write once read only memory cell 401 will be approximately 0.5 Volts ($\Delta$Vt=$\Delta$Q/Ci or $1.6 \times 10^{-7}/3 \times 10^{-7}$=½ Volt). In effect, the programmed write once read only memory cell, or modified MOSFET is a programmed MOSFET having a charge 417 trapped in the number of high work function nanoparticles, or nanocrystals, 440 within the gate oxide 410 adjacent to the first source/drain region, or source region, 402 such that the channel region has a first voltage threshold region (Vt1) and a second voltage threshold region (Vt2), where Vt2 is greater than Vt1, and Vt2 is adjacent the source region 402 such that the programmed MOSFET operates at reduced drain source current. For $\Delta Q = 10^{12}$ electrons/cm$^3$ in an area of $10^{-10}$ cm$^2$, this embodiment of the present invention involves trapping a charge 417 of approximately 100 electrons in the number of high work function nanoparticles, or nanocrystals, 440 within the gate oxide 410 adjacent to the source region 402 of the write once read only memory cell 401. In this embodiment, an original $V_T$ is approximately ½ Volt and the $V_T$ with charge trapping is approximately 1 Volt.

FIG. 4B aids to further illustrate the conduction behavior of the novel write once read only memory cell of the present invention. As one of ordinary skill in the art will understand upon reading this disclosure, if the write once read only memory cell is being driven with a control gate 416 voltage of 1.0 Volt (V) and the nominal threshold voltage without the number of high work function nanoparticles, or nanocrystals, 440 within the gate oxide 410 adjacent to the source region 402 charged is ½ V, then if the number of high work function nanoparticles, or nanocrystals, 440 within the gate oxide 410 adjacent to the source region 402 is charged the transistor of the present invention will be off and not conduct. That is, by trapping a charge 417 of approximately 100 electrons in the number of high work function nanoparticles, or nanocrystals, 440 within the gate oxide 410 adjacent to the source region 402 of the write once read only memory cell 401, having dimensions of 0.1 μm ($10^{-5}$ cm) by 0.1 μm, will raise the threshold voltage of the write once read only memory cell to 1.0 Volt and a 1.0 Volt gate potential will not be sufficient to turn the device on, e.g. Vt=1.0 V, I=0.

Conversely, if the nominal threshold voltage without the number of high work function nanoparticles, or nanocrystals, 440 within the gate oxide 410 adjacent to the source region 402 charged is ½ V, then $I=\mu C_{ox}\times(W/L)\times((Vgs-Vt)^2/2)$, or 12.5 μA, with $\mu C_{ox}=\mu C_i=100$ μA/$V^2$ and W/L=1. That is, the write once read only memory cell of the present invention, having the dimensions describe above will produce a current I=100 μA/$V^2\times(¼)\times(½)$=12.5 μA. Thus, in the present invention an un-written, or un-programmed write once read only memory cell can conduct a current of the order 12.5 uA, whereas if the number of high work function nanoparticles, or nanocrystals, 440 within the gate oxide 410 adjacent to the source region 402 is charged then the write once read only memory cell will not conduct. As one of ordinary skill in the art will understand upon reading this disclosure, the sense amplifiers used in DRAM arrays, and as describe above, can easily detect such differences in current on the bit lines.

By way of comparison, in a conventional DRAM cell 550 with a 30 femtoFarad (fF) storage capacitor 551 charged to 50 femto Coulombs (fC), if these are read over 5 nS then the average current on a bit line 552 is only 10 μA (I=50 fC/5 ns=10 μA). Thus, storing a 50 fC charge on the storage capacitor shown in FIG. 5 equates to storing 300,000 electrons (Q=50 fC/($1.6\times10^{-19}$)=$30\times10^4$=300,000 electrons).

According to the teachings of the present invention, the transistors in the array are utilized not just as passive on or off switches as transfer devices in DRAM arrays but rather as active devices providing gain. In the present invention, to program the transistor "off," requires only a stored charge 417 in the number of high work function nanoparticles, or nanocrystals, 440 within the gate oxide 410 adjacent to the source region 402 of only about 100 electrons if the area is 0.1 μm by 0.1 μm. And, if the write once read only memory cell is un-programmed, e.g. no stored charge trapped in the number of high work function nanoparticles, or nanocrystals, 440 within the gate oxide 410 adjacent to the source region 402, and if the transistor is addressed, via control gate 416, over 10 nS a of current of 12.5 μA is provided. The integrated drain 404 current then has a charge of 125 fC or 800,000 electrons. This is in comparison to the charge on a DRAM capacitor of 50 fC which is only about 300,000 electrons. Hence, the use of the transistors in the array as active devices with gain, rather than just switches, provides an amplification of the stored charge, in the number of high work function nanoparticles, or nanocrystals, 440 within the gate oxide 410 adjacent to the source region 402, from 100 to 800,000 electrons over a read address period of 10 nS.

Figure 6:
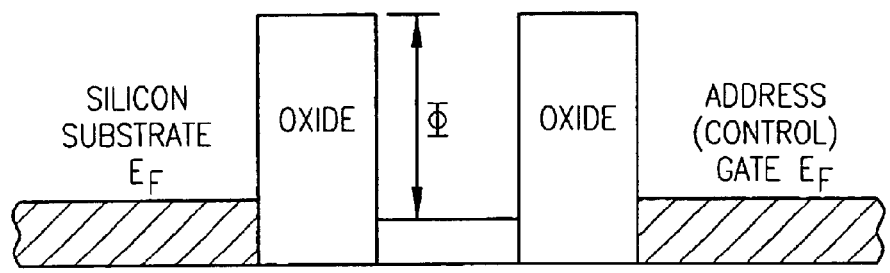
FIGS. 6 and 7 illustrate the dependence of tunneling current on barrier height as applicable to the present invention.
Figure 7:
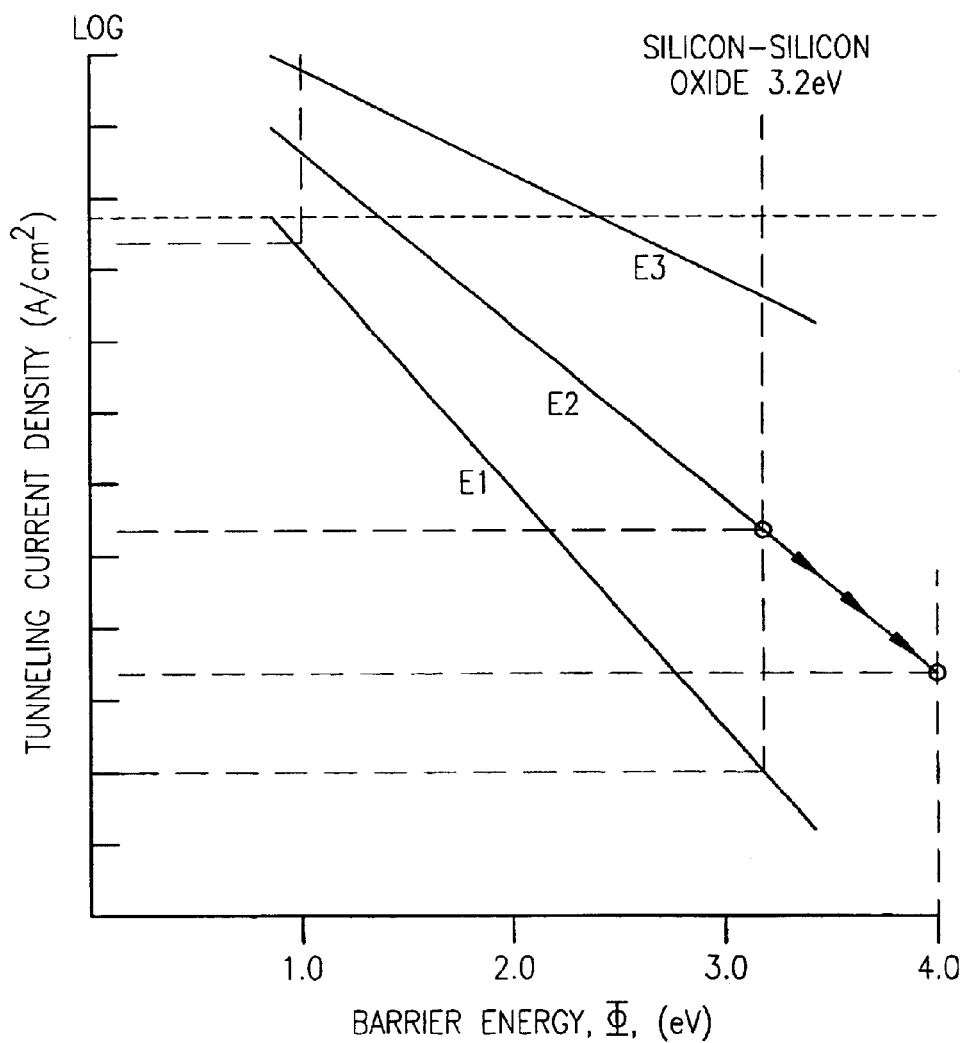

The unique aspect of this disclosure is the use of nanocrystals, or nanoparticles isolated from each other and electrically floating to act as floating gates with large work functions to increase the tunneling barriers with the silicon oxide gate insulators on each side of these nanocrystals or nanoparticles, as shown in FIG. 4A. Current flash memories utilize a floating polysilicon gate over a silicon dioxide gate insulator of thickness of the order 100 Å or 10 nm or less in a field effect transistor. This results in a high barrier energy, as shown in FIGS. 6 and 7, of around 3.2 eV for electrons between the silicon substrate and gate insulator and between the floating polysilicon gate and silicon oxide gate insulators. This combination of barrier height and oxide thickness results in long retention times even at 250 degrees Celsius. The simple idea would be that retention times are determined by thermal emission over the 3.2 eV barrier, however, these are extremely long so the current model is that retention is limited by F-N tunneling off of the charged gate. This produces a lower "apparent" activation energy of 1.5 eV as has been observed and shorter retention times. For archival storage in a write once mode of operation with no requirement to erase the longest possible retention times will be achieved with a number of high work function nanoparticles, or nanocrystals, 440, e.g. having work functions larger than 3.2 eV, within the gate oxide 410. FIG. 7 provides a chart showing the dependence of tunneling current on barrier height. FIG. 7 illustrates a number of different electric fields E1, E2, and E3 plotted for the log of various tunneling current density (A/$cm^2$) versus various barrier energy, Φ, (eV). The same is also described in a copending application by the same inventor and filed on even data herewith, entitled, "Write Once Read Only Memory with Large Work Function Floating gates," application Ser. No. 10/177,213, which is hereby incorporated in full by specific reference.

The design considerations involved for the retention time of silicon nanoparticles were recently outlined in simulations based on the size of the nanoparticles and the gate insulator thickness. The nanoparticles 440 as shown in FIG. 4A, should be of the order 50 Å to avoid quantum confinement effects, the gate insulator 410 should be of the order 50 Å or preferably thicker, and the read voltages low, of the order 2.0 Volts or less. This combined with the use of nanoparticles with large work functions 440 will provide retention times without any applied bias of the order $10^{15}$ seconds, or a million years. The practical retention time will be limited and determined by the number of read cycles but will still be archival.

The inventor in the present case has previously described the use of charge trapping on nanoparticles acting as floating gates in field effect transistors. (See generally, L. Forbes, "A MULTI-STATE FLASH MEMORY CELL AND METHOD FOR PROGRAMMING SINGLE ELECTRON DIFFERENCES," U.S. Pat. No. 5,740,104, issued Apr. 14, 1998; K. Y. Ahn and L. Forbes, "SINGLE ELECTRON MOSFET MEMORY DEVICE," U.S. Pat. No. 6,125,062, issued Sep. 26, 2000; K. Y. Ahn and L. Forbes, "SINGLE ELECTRON RESISTOR MEMORY DEVICE AND METHOD FOR USE THEREOF," U.S. Pat. No. 6,141,260, issued Oct. 31, 2000; and L. Forbes and K. Y. Ahn, "DYNAMIC MEMORY BASED ON SINGLE ELECTRON STORAGE," application Ser. No. 09/779,547, filed Feb. 9, 2001). All of the above listed references share a common ownership with the present disclosure at the time of invention. In contrast to the above work, this disclosure describes the use of nanoparticles with large work functions 440 buried in thick gate insulators 410 to provide extremely long retention times and archival storage. This is done at the expense of allowing for ease of erase of the stored charge, not an important consideration in write once memory applications, and at the expense of large detection signals, which is compensated for here by DRAM like arrays and comparing the sensed device to a dummy cell as is done in DRAM's. (See FIG. 3).

According to the teachings of the present invention, retention times will be increased by using:

(i) thick gate insulators between the silicon substrate and nanocrystal gates, since there is no requirement for erase lower electric fields result in lower tunneling currents and longer retention, see FIG. 6

(ii) thick gate insulators between the nanocrystals and address or control gate; since there is no requirement for erase lower electric fields result in longer retention times (iii) low read voltages on the address or control gates; since the DRAM sense amplifiers can sense small differences in conductivity states smaller biases can be applied to the devices resulting in lower electric fields and longer retention times This disclosure then describes the use of:

(i) refractory metal nanoparticles isolated from each other and electrically floating to act as floating gates, Mo and W, with vacuum work functions of around 4.7 eV which is larger than that of conventional n-type polysilicon floating gates with a vacuum work function of 4.1 eV, larger barriers result in lower tunneling currents and longer retention times, see FIG. 7 and the above cited references (ii) heavily doped p-type polysilicon floating and isolated nanocrystals with a vacuum work function of 5.3 eV, p-type nanocrystals of silicon-germanium for gates, or p-type nanocrystal gates of other semiconductors as silicon carbide, silicon oxycarbide, and GaN or AlGaN with vacuum work functions greater than conventional n-type polysilicon floating gates. Examples for the same, can be found in a number of patents issued to the same inventor; L. Forbes, "FLASH MEMORY WITH MICROCRYSTALLINE SILICON CARBIDE AS THE FLOATING GATE STRUCTURE," U.S. Pat. No. 5,801,401, issued Sep. 1, 1998, U.S. Pat. No. 5,989,958, issued Nov. 23, 1999, U.S. Pat. No. 6,166,401, Dec. 26, 2000; L. Forbes, J. Geusic and K. Ahn, "MICROCRYSTALLINE SILICON OXYCARBIDE GATES," U.S. Pat. No. 5,886,368, issued Mar. 23, 1999; L. Forbes and K. Y. Ahn, "DEAPROM AND TRANSISTOR WITH GALLIUM NITRIDE OR GALLIUM ALUMINUM NITRIDE GATE," U.S. Pat. No. 6,031,263, issued Feb. 29, 2000. The nanocrystals here are isolated crystal not in conductive contact with each other. Examples for the same, can be found in another patent issued to the same inventor; L. Forbes, "FLASH MEMORY WITH NANOCRYSTALLINE SILICON FILM AS THE FLOATING GATE," U.S. Pat. No. 5,852,306, issued Dec. 22, 1998. All of the above listed references share a common ownership with the present disclosure at the time of invention. In contrast to the above work, this disclosure describes the use of nanoparticles with large work function buried in thick gate insulators to provide extremely long retention times and archival storage.

Figure 8:
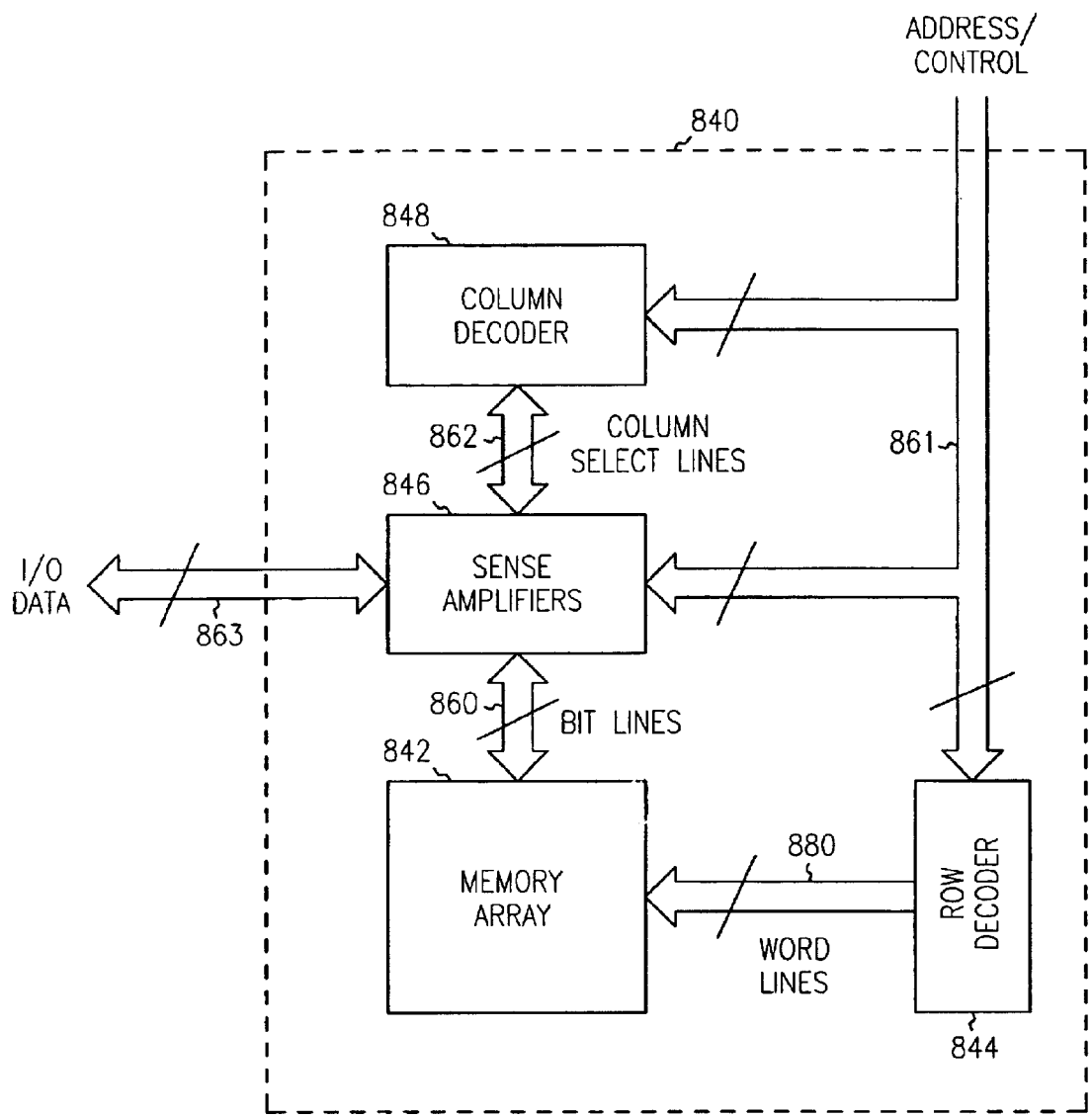
FIG. 8 illustrates a memory device according to the teachings of the present invention.

In FIG. 8 a memory device is illustrated according to the teachings of the present invention. The memory device 840 contains a memory array 842, row and column decoders 844, 848 and a sense amplifier circuit 846. The memory array 842 consists of a plurality of write once read only memory cells 800, formed according to the teachings of the present invention whose word lines 880 and bit lines 860 are commonly arranged into rows and columns, respectively. The bit lines 860 of the memory array 842 are connected to the sense amplifier circuit 846, while its word lines 880 are connected to the row decoder 844. Address and control signals are input on address/control lines 861 into the memory device 840 and connected to the column decoder 848, sense amplifier circuit 846 and row decoder 844 and are used to gain read and write access, among other things, to the memory array 842.

The column decoder 848 is connected to the sense amplifier circuit 846 via control and column select signals on column select lines 862. The sense amplifier circuit 846 receives input data destined for the memory array 842 and outputs data read from the memory array 842 over input/output (I/O) data lines 863. Data is read from the cells of the memory array 842 by activating a word line 880 (via the row decoder 844), which couples all of the memory cells corresponding to that word line to respective bit lines 860, which define the columns of the array. One or more bit lines 860 are also activated. When a particular word line 880 and bit lines 860 are activated, the sense amplifier circuit 846 connected to a bit line column detects and amplifies the conduction sensed through a given write once read only memory cell, where in the read operation the source region of a given cell is couple to a grounded array plate (not shown), and transfered its bit line 860 by measuring the potential difference between the activated bit line 860 and a reference line which may be an inactive bit line. The operation of Memory device sense amplifiers is described, for example, in U.S. Pat. Nos. 5,627,785; 5,280,205; and 5,042,011, all assigned to Micron Technology Inc., and incorporated by reference herein.

Figure 9:
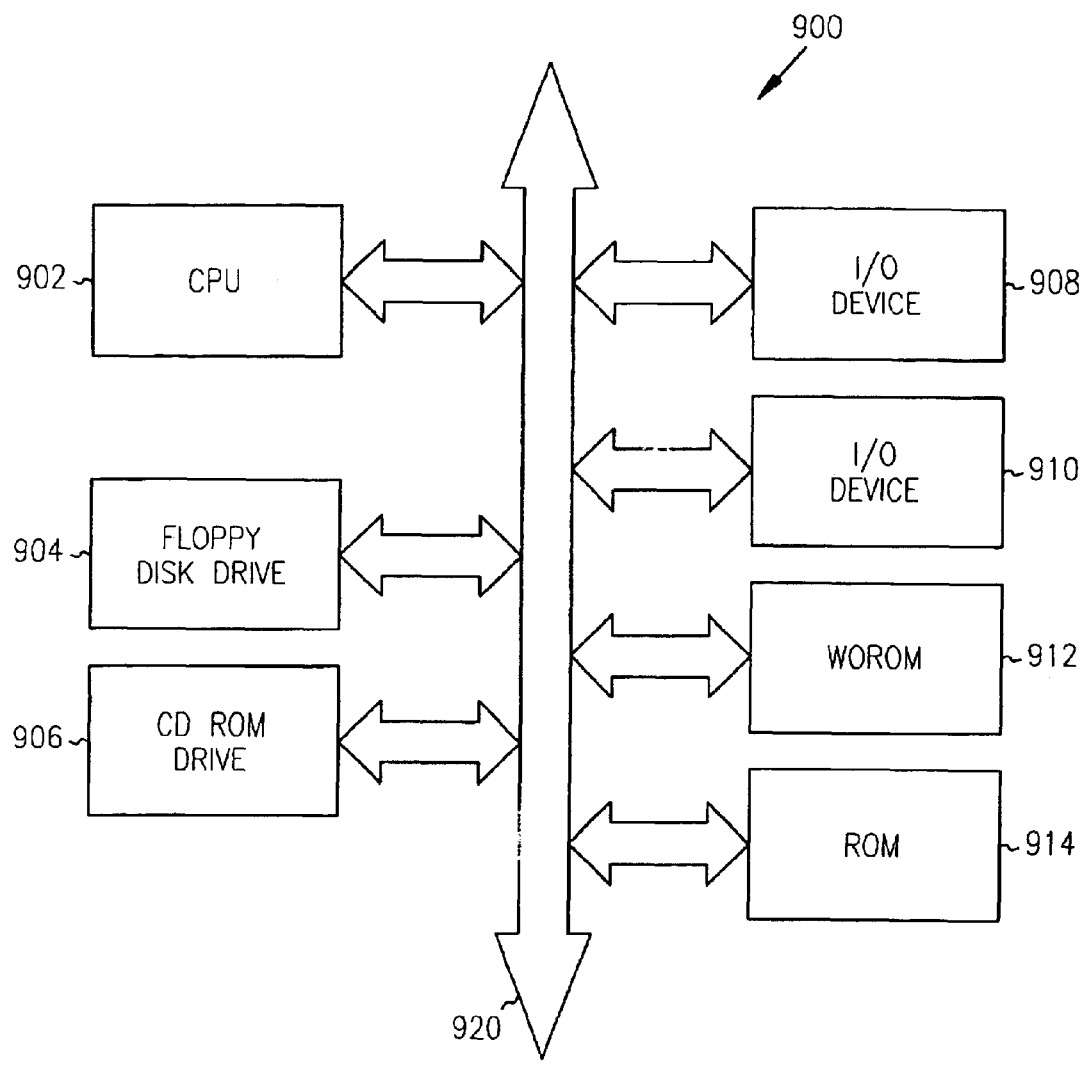
FIG. 9 is a block diagram of an electrical system, or processor-based system, utilizing write once read only memory constructed in accordance with the present invention.

FIG. 9 is a block diagram of an electrical system, or processor-based system, 900 utilizing write once read only memory 912 constructed in accordance with the present invention. That is, the write once read only memory (WOROM) 912 utilizes the modified DRAM cell as explained and described in detail in connection with FIGS. 2–4. The processor-based system 900 may be a computer system, a process control system or any other system employing a processor and associated memory. The system 900 includes a central processing unit (CPU) 902, e.g., a microprocessor, that communicates with the write once read only memory 912 and an I/O device 908 over a bus 920. It must be noted that the bus 920 may be a series of buses and bridges commonly used in a processor-based system, but for convenience purposes only, the bus 920 has been illustrated as a single bus. A second I/O device 910 is illustrated, but is not necessary to practice the invention. The processor-based system 900 can also includes read-only memory (ROM) 914 and may include peripheral devices such as a floppy disk drive 904 and a compact disk (CD) ROM drive 906 that also communicates with the CPU 902 over the bus 920 as is well known in the art.

It will be appreciated by those skilled in the art that additional circuitry and control signals can be provided, and that the memory device 900 has been simplified to help focus on the invention. At least one of the write once read only memory cell in WOROM 912 includes a programmed MOSFET having a charge trapped in the gate insulator adjacent to a first source/drain region, or source region, such that the channel region has a first voltage threshold region (Vt1) and a second voltage threshold region (Vt2), where Vt2 is greater than Vt1, and Vt2 is adjacent the source region such that the programmed MOSFET operates at reduced drain source current.

It will be understood that the embodiment shown in FIG. 9 illustrates an embodiment for electronic system circuitry in which the novel memory cells of the present invention are used. The illustration of system 900, as shown in FIG. 9, is intended to provide a general understanding of one application for the structure and circuitry of the present invention, and is not intended to serve as a complete description of all the elements and features of an electronic system using the novel memory cell structures. Further, the invention is equally applicable to any size and type of memory device 900 using the novel memory cells of the present invention and is not intended to be limited to that described above. As one of ordinary skill in the art will understand, such an electronic system can be fabricated in single-package processing units, or even on a single semiconductor chip, in order to reduce the communication time between the processor and the memory device.

Applications containing the novel memory cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

Conclusion

Utilization of a modification of well established DRAM technology and arrays will serve to afford an inexpensive memory device. The high density of DRAM array structures will afford the storage of a large volume of digital data or images at a very low cost per bit. There are many applications where the data need only be written once for archival storage. The thicker gate insulators, lower operating voltages and larger work functions of the nanocrystals acting as floating gates will insure long retention and archival storage.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A write once read only memory cell, comprising:
   a metal oxide semiconductor field effect transistor (MOSFET) in a substrate, the MOSFET including:
      a first source/drain region;
      a second source/drain region;
      a channel region between the first and the second source/drain regions;
      a gate insulator formed opposing the channel region, wherein the gate insulator includes a number of high work function nanoparticles; and
      a gate formed on the gate insulator;
   a plug coupled to the first source/drain region, wherein the plug couples the first source/drain region to an array plate;
   a transmission line coupled to the second source/drain region; and
   wherein the MOSFET is a programmed MOSFET having a charge trapped in the gate insulator adjacent to the first source/drain region such that the channel region has a first voltage threshold region (Vt1) and a second voltage threshold region (Vt2) and such that the programmed MOSFET operates at reduced drain source current.

2. The write once read only memory cell of claim 1, wherein the number of high work function nanoparticles include refractory metal nanoparticles isolated from each other and electrically floating to act as floating gates, the refractory metal nanoparticles selected from the group of molybdenum (Mo) and tungsten (W) with work functions of approximately 4.7 eV.

3. The write once read only memory cell of claim 1, wherein the number of high work function nanoparticles include large work function nanocrystals selected from the group of p-type nanocrystals of silicon germanium for gates, p-type nanocrystal gates of other semiconductors as silicon carbide, silicon oxycarbide, gallium nitride (GaN), and aluminum gallium nitride (AlGaN), wherein the nanocrystals are isolated from one another and not in conductive contact.

4. The write once read only memory cell of claim 1, wherein the number of high work function nanoparticles include heavily doped p-type polysilicon floating and isolated nanocrystals with a vacuum work function of 5.3 eV.

5. The write once read only memory cell of claim 1, wherein the second voltage threshold region (Vt2) in the channel is adjacent the first source/drain region, and wherein the first voltage threshold region (Vt1) in the channel is adjacent the second source/drain region.

6. The write once read only memory cell of claim 5, wherein the Vt2 has a higher voltage threshold than the Vt1.

7. The write once read only memory cell of claim 1, wherein the gate insulator has a thickness of at least 10 nanometers (nm).

8. A write once read only memory cell, comprising:
   a metal oxide semiconductor field effect transistor (MOSFET) in a substrate, the MOSFET having;
      a source region;
      a drain region;
      a channel region between the first and the second source/drain regions;
      a gate insulator formed opposing the channel region, wherein the gate insulator includes a number of high work function nanoparticles, wherein the number of high work function nanoparticles include refractory metal nanoparticles isolated from each other and electrically floating to act as floating gates, the refractory metal nanoparticles selected from the group of molybdenum (Mo) and tungsten (W) with work functions of approximately 4.7 eV; and
      a gate formed on the gate insulator;
   a wordline coupled to the gate;
   an array plate coupled to the source region;
   a bit line coupled to the drain region; and
   wherein the MOSFET is a programmed MOSFET having a charge trapped in the gate insulator adjacent to the source region such that the channel region has a first voltage threshold region (Vt1) adjacent to the drain region and a second voltage threshold region (Vt2) adjacent to the source region, the Vt2 having a greater voltage threshold than Vt1.

9. The write once read only memory cell of claim 8, wherein the gate insulator has a thickness of at least 10 nanometers (nm).

10. A memory array, comprising:
    a number of write once read only memory cells, wherein each write once read only memory cell includes;
       a first source/drain region;
       a second source/drain region;
       a channel region between the first and the second source/drain regions;
       a gate insulator formed opposing the channel region, wherein the gate insulator includes a number of high work function nanoparticles, wherein the number of high work function nanoparticles include large work function nanocrystals selected from the group of p-type silicon germanium gates, p-type polycrystalline gate of silicon carbide, p-type polycrystalline gate of silicon oxycarbide, gallium nitride (GaN), and aluminum gallium nitride (AlGaN), wherein the nanocrystals are isolated from one another and not in conductive contact; and a gate formed on the gate insulator;

a number of bit lines coupled to the second source/drain region of each write once read only memory cell along rows of the memory array;

a number of word lines coupled to the gate of each write once read only memory cell along columns of the memory array;

an array plate, wherein the first source/drain region of each write once read only memory cell is coupled to the array plate by a conductive plug; and wherein at least one of write once read only memory cells is a programmed MOSFET having a charge trapped in the gate insulator adjacent to the first source/drain region such that the channel region has a first voltage threshold region (Vt1) and a second voltage threshold region (Vt2) and such that the programmed MOSFET operates at reduced drain source current.

11. The memory array of claim 10, wherein the charge trapped in the gate insulator includes a charge of approximately 100 electrons.

12. The memory array of claim 10, wherein the first source/drain region of the MOSFET includes a source region and the second source/drain region of the MOSFET includes a drain region.

13. The memory array of claim 10, wherein the second voltage threshold region (Vt2) in the channel is adjacent the first source/drain region, and wherein the first voltage threshold region (Vt1) in the channel is adjacent the second source/drain region, and wherein Vt2 has a higher voltage threshold than the Vt1.

14. The memory array of claim 10, wherein the gate insulator of each write once read only memory cell has a thickness of at least 10 nanometers (nm).

15. A memory device, comprising:

a memory array, wherein the memory array includes a number of write once read only memory cells, wherein each write once read only memory cell includes;

a first source/drain region;

a second source/drain region;

a channel region between the first and the second source/drain regions;

a gate insulator formed opposing the channel region, wherein the gate insulator includes a number of high work function nanoparticles, wherein the number of high work function nanoparticles include heavily doped p-type polysilicon floating and isolated nanocrystals with a vacuum work function of 5.3 eV; and a gate formed on the gate insulator;

a number of bitlines coupled to the drain region of each write once read only memory cell along rows of the memory array;

a number of wordlines coupled to the gate of each write once read only memory cell along columns of the memory array;

an array plate, wherein the source region of each write once read only memory cell is coupled to the array plate by a conductive plug;

a wordline address decoder coupled to the number of wordlines;

a bitline address decoder coupled to the number of bitlines;

a sense amplifier coupled to the number of bitlines; and wherein at least one of the write once read only memory cells is a programmed MOSFET having a charge trapped in the gate insulator adjacent to the source region such that the channel region has a first voltage threshold region (Vt1) and a second voltage threshold region (Vt2) and such that the programmed MOSFET operates at reduced drain/source current.

16. The memory device of claim 15, wherein the charge trapped in the gate insulator includes a charge of approximately 100 electrons.

17. The memory device of claim 15, wherein the second voltage threshold region (Vt2) in the channel is adjacent the source region, and wherein the first voltage threshold region (Vt1) in the channel is adjacent the drain region, and wherein Vt2 has a higher voltage threshold than the Vt1.

18. The memory device of claim 15, wherein the gate insulator of each write once read only memory cell has a thickness of at least 10 nanometers (nm).

19. The memory device of claim 15, wherein the wordline address decoder and the bitline address decoder each include conventionally fabricated MOSFET transistors having thin gate insulators formed of silicon dioxide ($SiO_2$).

20. The memory device of claim 15, wherein the sense amplifier includes conventionally fabricated MOSFET transistors having thin gate insulators formed of silicon dioxide ($SiO_2$).

21. An electronic system, comprising:

a processor; and a memory device coupled to the processor, wherein the memory device includes:

a memory array, wherein the memory array includes a number of write once read only memory cells, wherein each write once read only memory cell includes;

a first source/drain region;

a second source/drain region;

a channel region between the first and the second source/drain regions;

a gate insulator formed opposing the channel region, wherein the gate insulator includes a number of high work function nanoparticles, wherein the number of high work function nanoparticles include heavily doped p-type polysilicon floating and isolated nanocrystals with a vacuum work function of 5.3 eV; and a gate formed on the gate insulator;

a number of bitlines coupled to the drain region of each write once read only memory cell along rows of the memory array;

a number of wordlines coupled to the gate of each write once read only memory cell along columns of the memory array;

an array plate, wherein the source region of each write once read only memory cell is coupled to the array plate by a conductive plug;

a wordline address decoder coupled to the number of wordlines;

a bitline address decoder coupled to the number of bitlines;

a sense amplifier coupled to the number of bitlines; and wherein at least one of the write once read only memory cells is a programmed MOSFET having a charge trapped in the gate insulator adjacent to the source region such that the channel region has a first voltage threshold region (Vt1) and a second voltage threshold region (Vt2) and such that the programmed MOSFET operates at reduced drain/source current.

22. The electronic system of claim 21, wherein the charge trapped in the gate insulator includes a charge of approximately 100 electrons.

23. The electronic system of claim 21, wherein, in a read operation, the array plate is coupled to a ground potential, the drain region of an addressed write once read only memory cell is precharged to a fractional voltage of VDD, and the memory cell is selected by a wordline address.

24. The electronic system of claim 21, wherein, in a write operation, the array plate is biased to a voltage higher than VDD, the drain region of an addressed write once read only memory cell is coupled to a ground, and the memory cell is selected by a wordline address.

25. A method for operating a memory, comprising:
programming a charge into a number of high work function nanoparticles located in a gate insulator of one or more transistors in a DRAM array, wherein each transistor in the DRAM array includes a write once read only memory cell including;
a source region;
a drain region;
a channel region between the first and the second source/drain regions;
a gate insulator formed opposing the channel region, wherein the gate insulator includes a number of high work function nanoparticles; and
a gate formed on the gate insulator;
a plug coupled to the source region, wherein the plug couples the source region to an array plate; and
a transmission line coupled to the drain region;
wherein programming a charge into a number of high work function nanoparticles located in a gate insulator of the one or more transistors includes:
applying a first voltage potential to the source region of the transistor;
applying a second voltage potential to the drain region of the transistor; and
applying a gate potential to a gate of the transistor; and
wherein applying the first, second and control gate potentials to the one or more transistors includes creating a hot electron injection into the number of high work function nanoparticles located in a gate insulator of the one or more transistors adjacent to the source region such that the one or more transistors become programmed transistors and operate at reduced drain source current when operated in a forward direction.

26. The method of claim 25, wherein applying a first voltage potential to the source region of the transistor includes applying a high voltage potential (VDD) to the array plate.

27. The method of claim 26, wherein applying a second voltage potential to the drain region includes grounding the drain region.

28. The method of claim 25, wherein applying a gate potential to the gate of the transistor includes applying a gate potential to the gate in order to create a conduction channel between the first and the second source/drain regions of the floating gate transistor.

29. The method of claim 25, wherein the method further includes reading one or more of the transistors in the DRAM array by operating an addressed transistor in a forward direction, wherein operating the transistor in the forward direction includes:
grounding the array plate;
precharging the transmission line to a fractional voltage of VDD; and
applying a gate potential of approximately 1.0 Volt to the gate of the addressed transistor.

30. The method of claim 24, wherein creating a hot electron injection into the number of high work function nanoparticles located in a gate insulator of one or more transistors includes changing a threshold voltage for the transistor by approximately 0.5 Volts.

31. The method of claim 25, wherein in creating a hot electron injection into the number of high work function nanoparticles located in a gate insulator of the one or more transistors adjacent to the source region includes creating a first threshold voltage region (Vt1) adjacent to the drain region and creating a second threshold voltage region (Vt2) adjacent to the source region, wherein Vt2 is greater than Vt1.

32. A method for write once read only memory, comprising:
writing to one or more MOSFETs in a DRAM array in a reverse direction, wherein each MOSFET in the DRAM array includes:
a source region;
a drain region;
a channel region between the first and the second source/drain regions;
a gate insulator formed opposing the channel region, wherein the gate insulator includes a number of high work function nanoparticles;
a gate formed on the gate insulator;
a plug coupled to the source region, wherein the plug couples the source region to an array plate; and
a transmission line coupled to the drain region;
wherein writing to the one or more MOSFETs in the reverse direction includes:
grounding the transmission line associated with an addressed MOSFET;
biasing the array plate to a voltage higher than VDD;
applying a gate potential to the gate of the addressed MOSFET creating a hot electron injection into the number of high work function nanoparticles in the gate insulator of the addressed MOSFET adjacent to the source region such that the addressed MOSFET becomes a programmed MOSFET and will operate at reduced drain source current in a forward direction; and
reading one or more MOSFETs in the DRAM array in a forward direction, wherein reading the one or more MOSFETs in the forward direction includes:
grounding the array plate;
precharging the bitline associated with an addressed MOSFET to a fractional voltage of VDD; and
applying a gate potential of approximately 1.0 Volt to the gate of the addressed MOSFET.

33. The method of claim 32, wherein creating a hot electron injection into the number of high work function nanoparticles in the gate insulator of the addressed MOSFET adjacent to the source region includes creating a first threshold voltage region (Vt1) adjacent to the drain region and creating a second threshold voltage region (Vt2) adjacent to the source region, wherein Vt2 is greater that Vt1.

34. The method of claim 32, wherein creating a hot electron injection into the number of high work function nanoparticles in the gate insulator of the addressed MOSFET adjacent to the source region includes changing a threshold voltage for the MOSFET by approximately 0.5 Volts.

35. The method of claim 32, wherein creating a hot electron injection into the number of high work function nanoparticles in the gate insulator of the addressed MOSFET adjacent to the source region includes trapping a stored charge in the number of high work function nanoparticles in the gate insulator of the addressed MOSFET of approximately $10^{12}$ electrons/cm$^2$.

36. The method of claim 32, wherein creating a hot electron injection into the number of high work function nanoparticles in the gate insulator of the addressed MOSFET adjacent to the source region includes trapping a stored charge in the number of high work function nanoparticles in the gate insulator of the addressed MOSFET of approximately 100 electrons.

37. The method of claim 32, wherein the method further includes using the MOSFETs in the DRAM array as active devices with gain, and wherein reading a programmed MOSFET includes providing an amplification of the stored charge in the gate insulator from 100 to 800,000 electrons over a read address period of approximately 10 ns.

38. The method of claim 32, wherein reading the one or more MOSFETs in the forward direction includes using a sense amplifier to detect whether an addressed MOSFET is a programmed MOSFET, wherein a programmed MOSFET will not conduct, and wherein an un-programmed MOSFET addressed over approximately 10 ns will conduct a current of approximately 12.5 $\mu$A such that the method includes detecting an integrated drain current having a charge of 800,000 electrons using the sense amplifier.

39. A method for forming a write once read only memory cell, comprising:
    forming a metal oxide semiconductor field effect transistor (MOSFET); wherein forming the MOSFET includes:
        forming a source region;
        forming a drain region;
        forming a channel region between the first and the second source/drain regions;
        forming a gate insulator opposing the channel region, wherein forming the gate insulator includes forming a number of high work function nanoparticles in the gate insulator; and
        forming a gate on the gate insulator;
    forming an array plate;
    forming a conductive plug coupling the source region to the array plate; and
    forming a transmission line coupled to the drain region such that the write once read only memory cell can be programmed in a reverse direction to have a trapped charge in the number of high work function nanoparticles in the gate insulator adjacent to the source region by biasing the array plate to a voltage higher than VDD, grounding the transmission line, and selecting the gate by a wordline address, and wherein the programmed MOSFET will operate at reduced drain source current in a forward direction.

40. The method of claim 39, wherein forming the number of high work function nanoparticles in the gate insulator includes forming the number of high work function nanoparticles of refractory metal nanoparticles isolated from each other and electrically floating to act as floating gates, the refractory metal nanoparticles selected from the group of molybdenum (Mo) and tungsten (W) with work functions of approximately 4.7 eV.

41. The method of claim 39, wherein forming the number of high work function nanoparticles in the gate insulator includes forming the number of high work function nanoparticles of large work function nanocrystals selected from the group of of p-type nanocrystals of silicon germanium for gates, p-type nanocrystal gates of other semiconductors as silicon carbide, silicon oxycarbide, gallium nitride (GaN), and aluminum gallium nitride (AlGaN), wherein the nanocrystals are isolated from one another and not in conductive contact.

42. The method of claim 39, wherein forming the number of high work function nanoparticles in the gate insulator includes forming the number of high work function nanoparticles of heavily doped p-type polysilicon floating and isolated nanocrystals with a vacuum work function of 5.3 eV.

43. The method of claim 39, wherein forming a MOSFET such that the write once read only memory cell can be programmed in a reverse direction to have a trapped charge in the number of high work function nanoparticles in the gate insulator adjacent to the source region includes forming the MOSFET such that a second voltage threshold region (Vt2) can be formed in the channel adjacent the source region and a first voltage threshold region (Vt1) can be formed in the channel adjacent the drain region, wherein the Vt2 has a higher voltage threshold than the Vt1.

* * * * *

UNITED STATES PATENT AND TRADEMARK OFFICE
CERTIFICATE OF CORRECTION

PATENT NO. : 6,888,739 B2
DATED : May 3, 2005
INVENTOR(S) : Forbes

It is certified that error appears in the above-identified patent and that said Letters Patent is hereby corrected as shown below:

Title page,
Item [56], References Cited, FOREIGN PATENT DOCUMENTS, after "2/1999" insert -- G11C --.
OTHER PUBLICATIONS, "Hwang, N., et al." reference, insert -- " -- before "Tunneling"; and after "a" delete ".".
"Distribution of Deep Traps in SiO" reference, after "SiO" insert -- " --.
"Akasaki, I." reference, delete "Ga(1-x)A(x)N" and insert -- Ga(1-x)Al(x)N --, therefor.
"Asari, K, et al." reference, after "1999" delete "," and insert-- . --, therefor.
"Nakajima, Anri, K, et al." reference, after "Meeting" insert-- . --.

Column 1,
Line 33, delete "e.g" and insert -- e.g. --, therefor.

Column 2,
Line 10, after "35-38)" delete ";" and insert -- . --, therefor.

Column 9,
Line 17, delete "Vdd" and insert -- VDD --, therefor.

Column 11,
Line 11, delete "$\mu C_l$" and insert -- $\mu C_i$ --, therefor.
Line 17, delete "uA" and insert -- $\mu$A --, therefor.

Column 17,
Line 16, after "of" insert -- the --.

Column 20,
Line 10, after "wherein" delete "in".

Column 21,
Line 7, delete "$10^{12}$" and insert -- 1012 --, therefor.

UNITED STATES PATENT AND TRADEMARK OFFICE
CERTIFICATE OF CORRECTION

PATENT NO. : 6,888,739 B2
DATED : May 3, 2005
INVENTOR(S) : Forbes

It is certified that error appears in the above-identified patent and that said Letters Patent is hereby corrected as shown below:

Column 22,
Line 24, after "group" delete "of".

Signed and Sealed this

Nineteenth Day of July, 2005

JON W. DUDAS
*Director of the United States Patent and Trademark Office*